(12) United States Patent
Le et al.

(10) Patent No.: US 10,726,892 B2
(45) Date of Patent: Jul. 28, 2020

(54) METALLIC MAGNETIC MEMORY DEVICES FOR CRYOGENIC OPERATION AND METHODS OF OPERATING THE SAME

(71) Applicant: SANDISK TECHNOLOGIES LLC, Addison, TX (US)

(72) Inventors: Quang Le, San Jose, CA (US); Zhanjie Li, Pleasanton, CA (US); Zhigang Bai, Fremont, CA (US); Paul Vanderheijden, Cupertino, CA (US); Michael Ho, Redwood City, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/212,132

(22) Filed: Dec. 6, 2018

(65) Prior Publication Data

US 2020/0185015 A1 Jun. 11, 2020

(51) Int. Cl.
| | |
|---|---|
| *G11C 11/00* | (2006.01) |
| *G11C 11/16* | (2006.01) |
| *H01L 43/02* | (2006.01) |
| *H01L 27/22* | (2006.01) |
| *H01L 43/10* | (2006.01) |
| *G11C 11/18* | (2006.01) |

(52) U.S. Cl.
CPC ........ *G11C 11/161* (2013.01); *G11C 11/1675* (2013.01); *H01L 27/228* (2013.01); *H01L 43/02* (2013.01); *H01L 43/10* (2013.01); *G11C 11/18* (2013.01)

(58) Field of Classification Search
CPC ... G11C 11/161; G11C 11/1675; G11C 11/18; H01L 27/228; H01L 43/02; H01L 43/10

USPC .......................................... 365/158, 171, 173
See application file for complete search history.

(56) References Cited

U.S. PATENT DOCUMENTS

| | | | |
|---|---|---|---|
| 7,826,258 B2 | 11/2010 | Zhu et al. | |
| 9,853,206 B2 | 12/2017 | Pinarbasi et al. | |
| 10,270,027 B1 | 4/2019 | Gajek et al. | |
| 2002/0105823 A1 | 8/2002 | Redon et al. | |
| 2009/0108383 A1 | 4/2009 | Horng et al. | |
| 2011/0007560 A1 | 1/2011 | Dieny et al. | |
| 2012/0314490 A1* | 12/2012 | Okhi .................. | G11C 11/1659 365/158 |

(Continued)

FOREIGN PATENT DOCUMENTS

| | | |
|---|---|---|
| EP | 2209123 A1 | 7/2010 |
| JP | 2005150482 A | 6/2005 |

OTHER PUBLICATIONS

U.S. Appl. No. 15/701,761, filed Sep. 12, 2017, Sandisk Technologies LLC.

(Continued)

*Primary Examiner* — Huan Hoang
(74) *Attorney, Agent, or Firm* — The Marbury Law Group, PLLC

(57) ABSTRACT

A MRAM device includes a spin valve containing a reference layer having a fixed magnetization direction, a free layer, and a nonmagnetic metallic barrier layer located between the reference layer and the free layer, a metallic assist structure configured to provide rotating spin transfer torque to the free layer to assist the free layer switching during programming, and a first nonmagnetic metallic spacer layer located between the free layer and the metallic assist structure.

20 Claims, 17 Drawing Sheets

(56) References Cited

U.S. PATENT DOCUMENTS

| | | |
|---|---|---|
| 2013/0154038 A1 | 6/2013 | Horng et al. |
| 2014/0056060 A1 | 2/2014 | Khvalkovskiy et al. |
| 2014/0056061 A1 | 2/2014 | Khvalkovskiy et al. |
| 2014/0070341 A1 | 3/2014 | Beach et al. |
| 2014/0175575 A1 | 6/2014 | Doyle et al. |
| 2014/0308760 A1 | 10/2014 | Doyle et al. |
| 2015/0001656 A1 | 1/2015 | Beach et al. |
| 2015/0097159 A1 | 4/2015 | Apalkov et al. |
| 2015/0129995 A1 | 5/2015 | Wang et al. |
| 2015/0200003 A1 | 7/2015 | Buhrman et al. |
| 2015/0214275 A1* | 7/2015 | Hsueh .................. H01L 27/228 257/401 |
| 2015/0255711 A1 | 9/2015 | Doyle et al. |
| 2015/0372687 A1 | 12/2015 | Buhrman et al. |
| 2016/0276006 A1 | 9/2016 | Ralph et al. |
| 2016/0359101 A1 | 12/2016 | Kuo et al. |
| 2016/0379698 A1 | 12/2016 | Saida et al. |
| 2017/0040530 A1 | 2/2017 | Doyle et al. |
| 2017/0069365 A1 | 3/2017 | Buhrman et al. |
| 2017/0117027 A1 | 4/2017 | Braganca et al. |
| 2017/0125078 A1 | 5/2017 | Mihajlovic et al. |
| 2017/0178705 A1 | 6/2017 | Buhrman et al. |
| 2017/0243917 A1 | 8/2017 | Manipatruni et al. |
| 2017/0249550 A1 | 8/2017 | Sengupta et al. |
| 2017/0330070 A1 | 11/2017 | Sengupta et al. |
| 2018/0033954 A1* | 2/2018 | Aradhya ................. H01L 43/06 |
| 2018/0061467 A1 | 3/2018 | Kan et al. |
| 2018/0090194 A1 | 3/2018 | Silva et al. |
| 2018/0106873 A1 | 4/2018 | Wu et al. |
| 2018/0123028 A1 | 5/2018 | Shiokawa et al. |
| 2018/0166625 A1 | 6/2018 | Kuo et al. |

OTHER PUBLICATIONS

U.S. Appl. No. 15/728,840, filed Oct. 10, 2017, Sandisk Technologies LLC.
U.S. Appl. No. 16/024,490, filed Jun. 29, 2018, Sandisk Technologies LLC.
U.S. Appl. No. 16/024,521, filed Jun. 29, 2018, Sandisk Technologies LLC.
U.S. Appl. No. 16/212,257, filed Dec. 6, 2018, Sandisk Technologies LLC.
U.S. Appl. No. 16/212,342, filed Dec. 6, 2018, Sandisk Technologies LLC.
U.S. Appl. No. 16/212,420, filed Dec. 6, 2018, Sandisk Technologies LLC.
"Giant Magnetorestriction in Annealed $Co_{1-x}Fe_x$ Thin Films," Hunter et al., Nat. Commun. 2, 518 (2011).
"Effect of 90° Domain Movement on the Piezoelectric Response of Patterend PbZr 0.2 Ti 0.8 O 3/SrTiO 3/Si Heterostuctures," Ma et al., Appl. Phys. Lett. 87, 072907 (2005).
Notification of Transmittal of the International Search Report and Written Opinion of the International Search Authority for International Patent Application No. PCT/US2019/046717, dated Nov. 17, 2019, 11 pages.
Notification of Transmittal of the International Search Report and Written Opinion of the International Search Authority or International Patent Application No. PCT/US2019/049189, dated Dec. 19, 2019, 16 pages.
USPTO Office Communication, Non-Final Office Action for U.S. Appl. No. 16/212,420, dated Nov. 27, 2019, 10 pages.
USPTO Office Communication, Non-Final Office Action for U.S. Appl. No. 16/212,257, dated Dec. 13, 2019, 16 pages.

\* cited by examiner

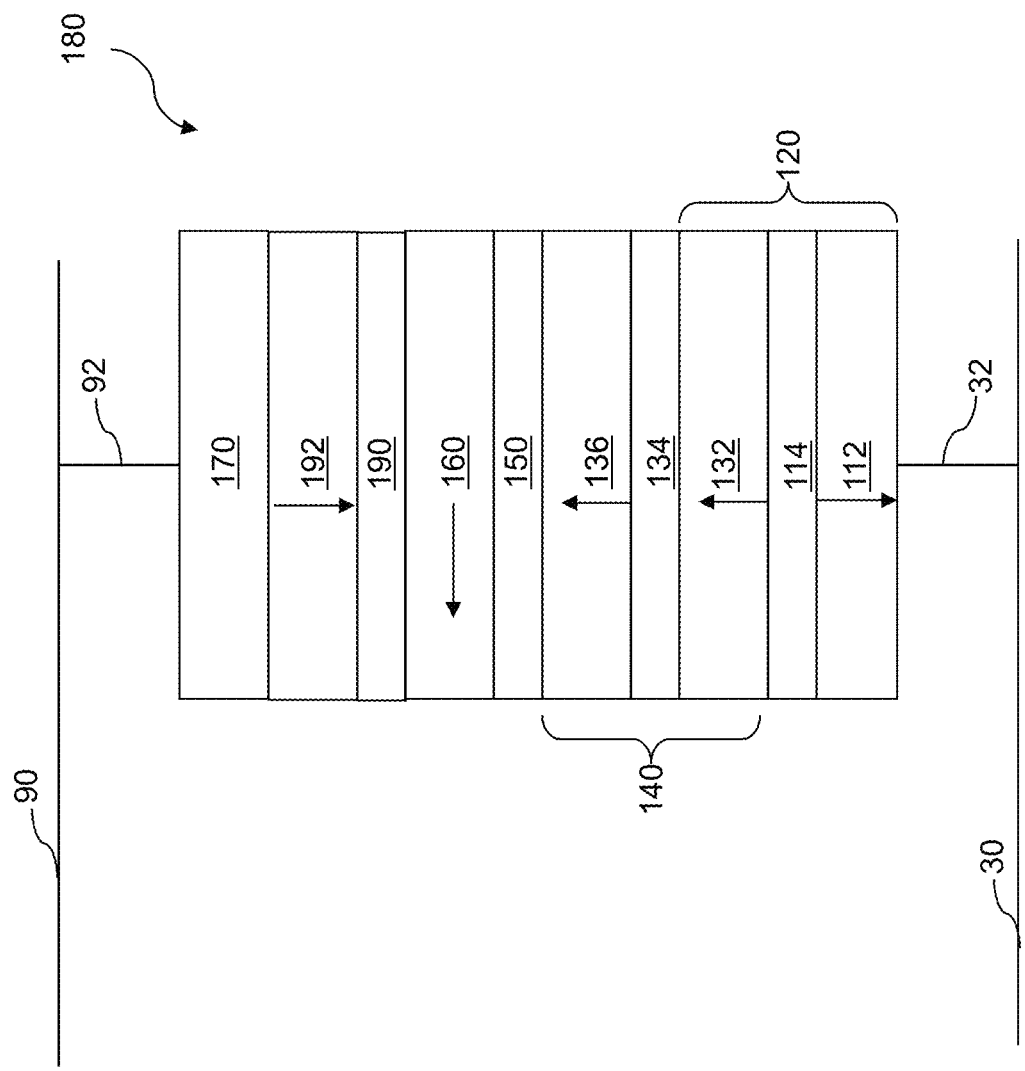

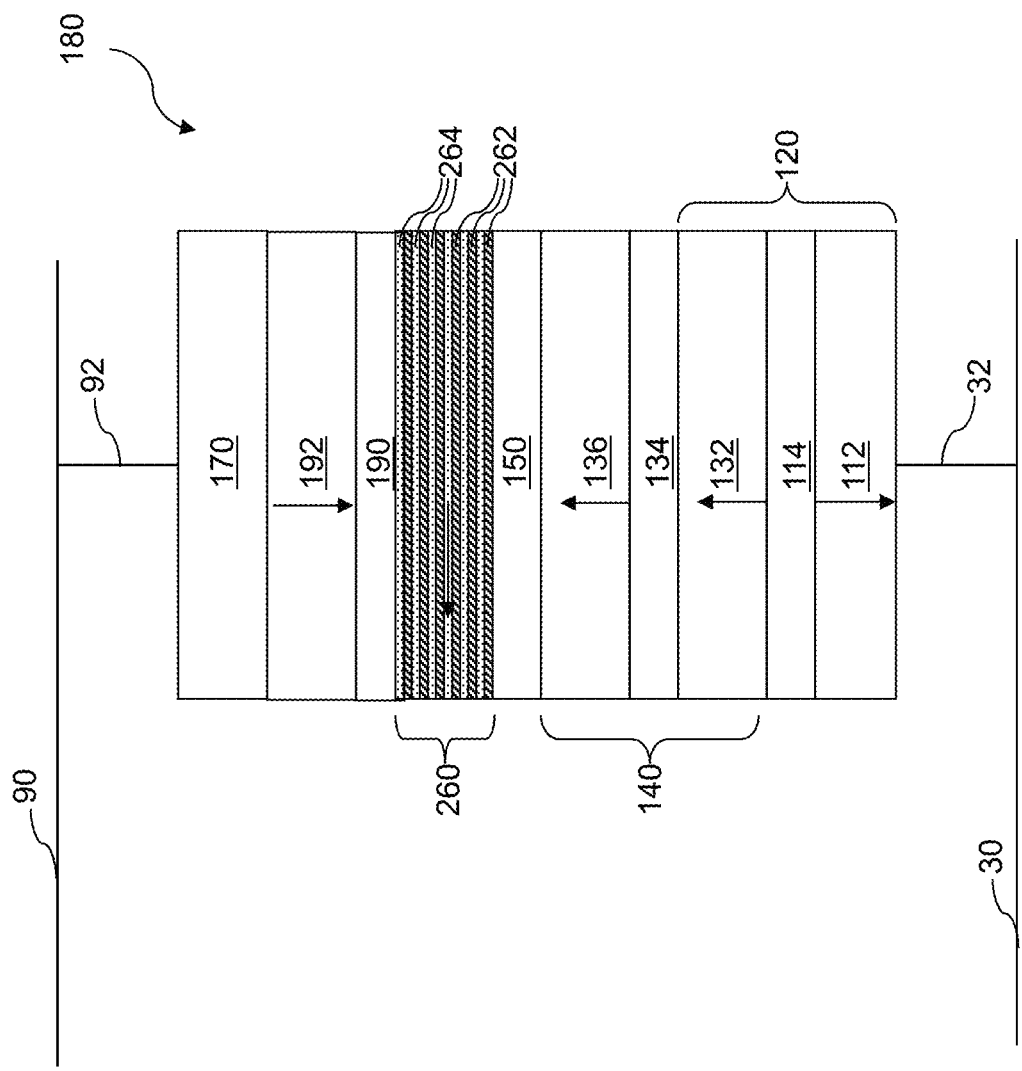

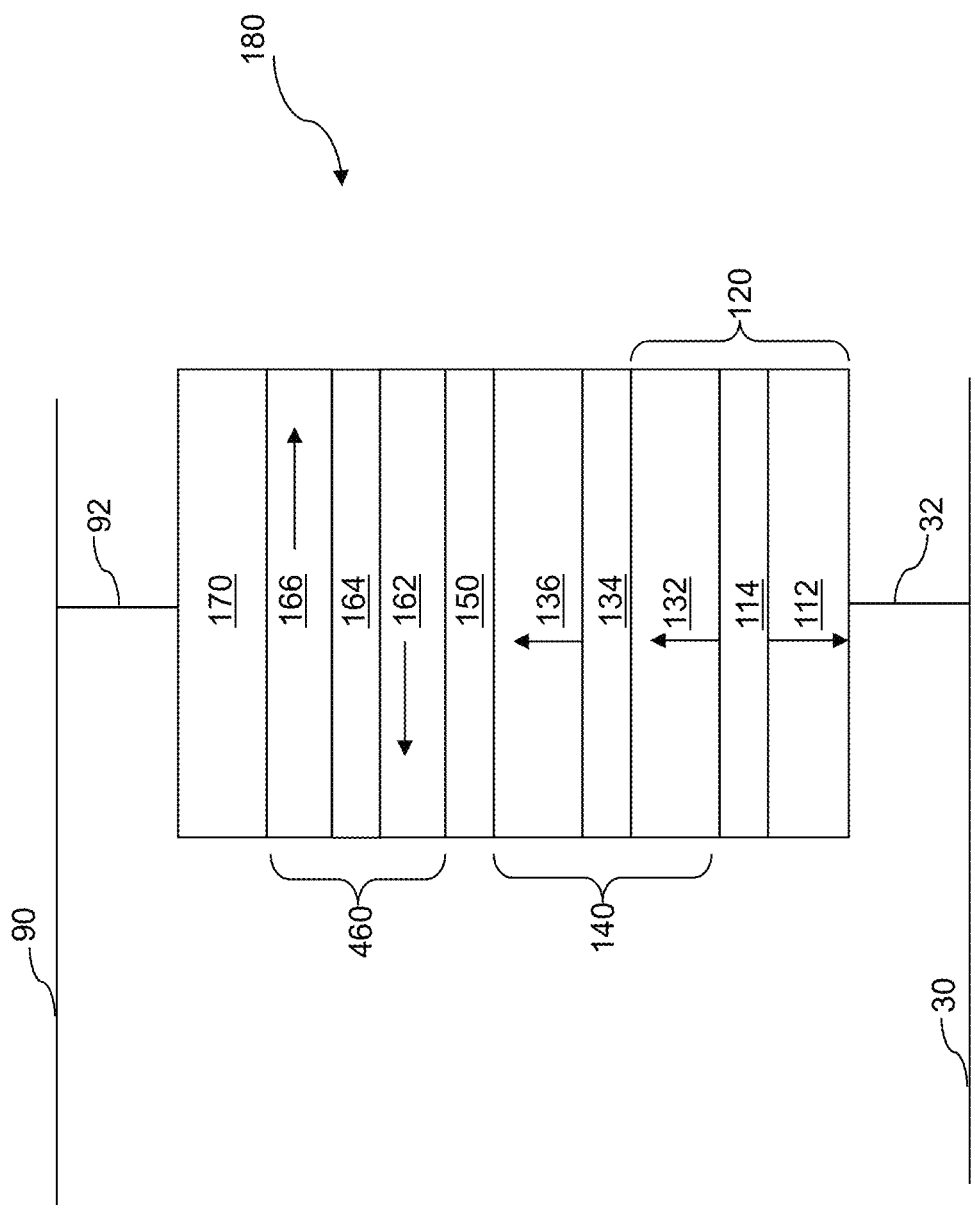

METALLIC MAGNETIC MEMORY DEVICES FOR CRYOGENIC OPERATION AND METHODS OF OPERATING THE SAME

FIELD

The present disclosure relates generally to the field of magnetic memory devices and specifically to metallic magnetic memory devices, such as magnetoresistive random access memory (MRAM) devices with at least one assist layer and methods of operating the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing torque to magnetize the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of a reference layer.

SUMMARY

According to an aspect of the present disclosure, a MRAM device includes a spin valve containing a reference layer having a fixed magnetization direction, a free layer, and a nonmagnetic metallic barrier layer located between the reference layer and the free layer, a metallic assist structure configured to provide rotating spin transfer torque to the free layer to assist the free layer switching during programming, and a first nonmagnetic metallic spacer layer located between the free layer and the metallic assist structure.

According to another aspect of the present disclosure, a spin orbit torque memory device comprises a spin valve comprising a reference layer having a fixed magnetization direction, a free layer, and a nonmagnetic metallic barrier layer located between the reference layer and a first surface of the free layer, a metal line contacting a second surface of the free layer, wherein the metal line consists essentially of at least one elemental metal having an atomic number from 72 to 79, a first electrode electrically connected to a first end of the metal line and to a first transistor, a second electrode electrically connected to a second end of the metal line, wherein the second surface of the free layer contacts the metal line between the first electrode and the second electrode, a third electrode electrically connected to the reference layer and to a second transistor, and a programming controller configured to control the first transistor and the second transistor to provide a two-step programming process for a magnetization of the free layer. The two-step programming process comprises a first programming pulse application step in which the first transistor is turned on and the second transistor is turned off, and a first electrical current flows through the metal line between the first electrode and the second electrode, and a second programming pulse application step in which the second transistor is turned on and the first transistor is turned off, and a second electrical current flows through the spin valve between the third electrode and the second electrode.

According to another aspect of the present disclosure a method of programming a spin orbit torque memory device comprising a spin valve comprising a reference layer having a fixed magnetization direction, a free layer, and a nonmagnetic metallic barrier layer located between the reference layer and a first surface of the free layer, a metal line contacting a second surface of the free layer, a first electrode electrically connected to a first end of the metal line, a second electrode electrically connected to a second end of the metal line, and a third electrode electrically connected to the reference layer, the method comprising applying a first programming pulse between the first and the second electrodes such that a first electrical current flows through the metal line between the first electrode and the second electrode, and applying a second programming pulse between the second and the third electrodes such that a second electrical current flows through the spin valve between the third electrode and the second electrode. The method is performed at a temperature below 77 degrees Kelvin.

BRIEF DESCRIPTION OF THE DRAWINGS

FIG. 2C illustrates a third configuration of the first exemplary STT MRAM cell according to the first embodiment of the present disclosure.

FIG. 2D illustrates a fourth configuration of the first exemplary STT MRAM cell according to the first embodiment of the present disclosure.

FIG. 3A illustrates a first configuration of a second exemplary STT MRAM cell according to a second embodiment of the present disclosure.

DETAILED DESCRIPTION

Figure 1:
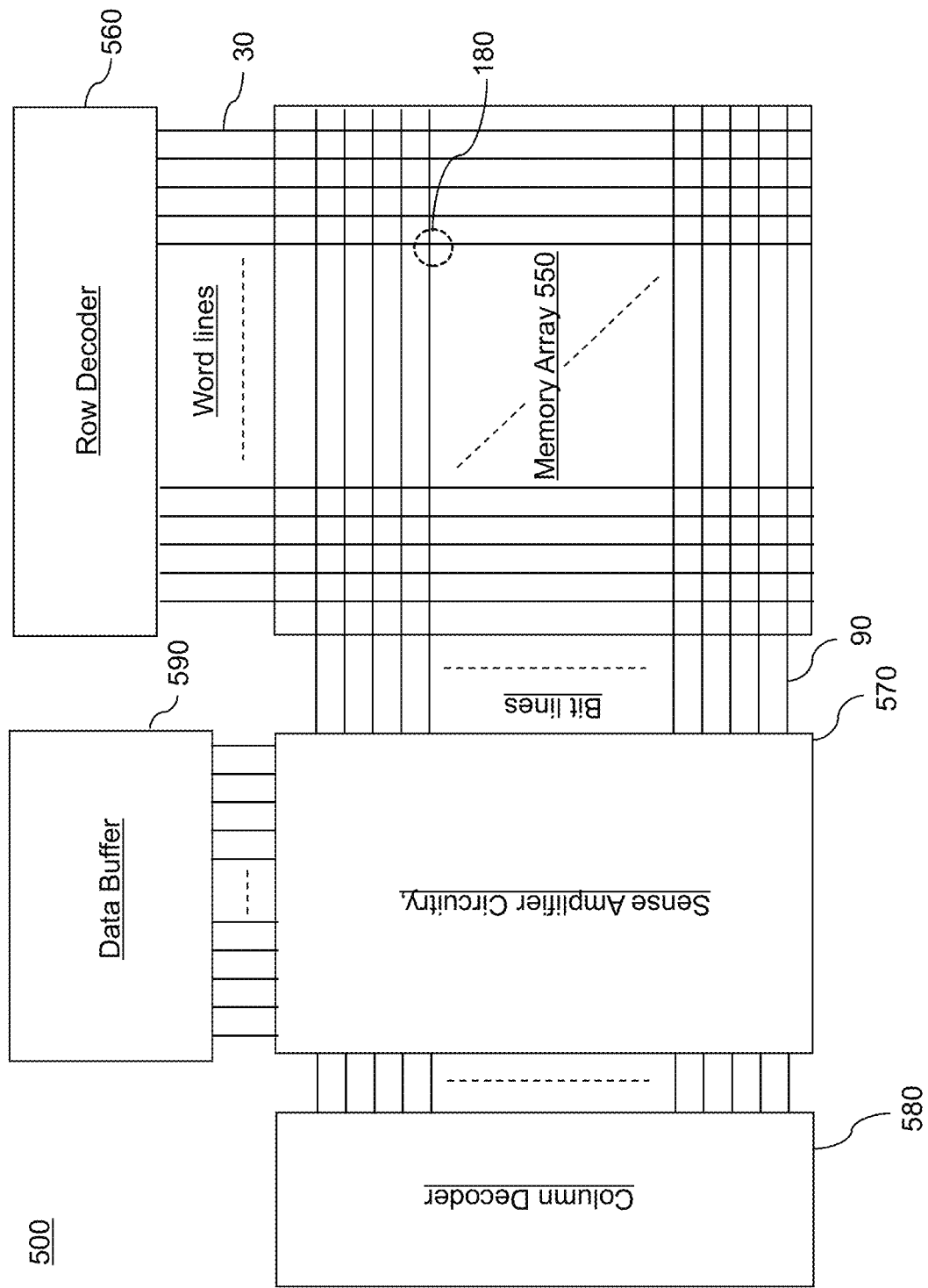
FIG. 1 is a schematic diagram of a memory device including magnetoresistive memory cells of the present disclosure in an array configuration.

Quantum computing is projected to offer superior performance than conventional computing. However, quantum computing presents unique characteristics and challenges due to its specific requirements on operating conditions, in particular temperature. Typically quantum computing devices would require to operate at extremely low temperatures cryogenic temperatures (e.g., below 77 degrees Kelvin, such as below 10 degrees Kelvin). One key challenge associated with perpendicular magnetic tunnel junction (pMTJ) type STT MRAM devices is that both reference layer and free layer magnetizations are along the direction perpendicular to the stack plane. As a result, the initial torque during switching of the free layer is nearly zero. In conventional pMTJ STT-MRAM, the initial "kick" for the free layer switching comes from the thermal fluctuation induced random effective field. For quantum computing environment at cryogenic temperature, this thermal random field is nearly zero, making the free layer switching much more difficult. Thus, the magnitude of the electrical current used to induce a transition at a cryogenic temperature from a parallel state to an antiparallel state, or from an antiparallel state to a parallel state, is greater than desired (e.g., greater than the magnitude the electrical current required to induce the same transition at room temperature). Other desired characteristics specific to MRAM devices in a quantum computing environment includes much reduced perpendicular anisotropy for the free layer, as well as much reduced resistance for the MRAM elements, which further puts constraints on pMTJ MRAM devices which usually has much higher resistance due to the electrically insulating tunneling layer (e.g., MgO) located between the free and reference layers.

Embodiments of the present disclosure provide MRAM devices, such as STT and/or MRAM devices suitable cryogenic operation (e.g., at a temperature below 77 degrees Kelvin, such as below 10 degrees Kelvin). In one embodiment, each MRAM cell contains a stack of only metallic layers and does not include any electrically insulating layers, such as MgO. As used herein, the term "metallic" means layers that are electrically conductive and comprise either a pure metal or a metal alloy. Electrically conductive layers lack a band gap between valence and conduction bands that is typically found in semiconductor and electrically insulating layers. -. Thus, the MRAM cell lacks a tunneling layer, such as MgO (i.e., the MRAM cell is not an MTJ cell), and instead includes a non-magnetic metallic spacer layer, such as Cu metal or AgSn metal alloy. The metallic layers provide a long spin diffusion length and low resistivity, to provide the polarized spin currents and spin torques while keeping the total resistance of the MRAM cell layer stack low (e.g. <10 Ohm, such as 0.1 to 9 Ohm).

In one embodiment the MRAM cell includes an assist structure which may provide rotating spin transfer torque to the free layer to assist the free layer switching during the writing process. In one embodiment, this will not only resolve the zero initial torque issue due to low temperature, but the rotating STT from the assist structure may also provide torque to the free layer throughout the switching process, thus maximizing the assisting effect.

In some embodiments, the metallic MRAM cells can be used at cryogenic temperatures for any suitable applications, such as quantum computing applications. The effective anisotropy of the free layer is much lower (e.g., greater than 10 times lower) than that of typical pMTJ STT-MRAM. This is made possible by the very low cryogenic operating temperature, thus much lower $k_BT$ term, which leads to much lower anisotropy needed to maintain the same thermal stability factor for data retention. This also further reduces the switching current needed.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified. As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1, a schematic diagram is shown for a magnetic memory device including memory cells 180 of an embodiment present disclosure in an array configuration. The magnetic memory device can be configured as a MRAM device 500 containing MRAM cells 180. As used herein, a "MRAM device" refers to a memory device containing cells that allow random access, e.g., access to any selected memory cell upon a command for reading the contents of the selected memory cell.

The MRAM device 500 of an embodiment of the present disclosure includes a memory array region 550 containing an array of the respective MRAM cells 180 located at the intersection of the respective word lines (which may comprise electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). The MRAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the MRAM cells 180 are provided in an array configuration that forms the MRAM device 500. As such, each of the MRAM cells 180 can be a two-terminal device including a respective first electrode and a respective second electrode. It should be noted that the location and interconnection of elements are schematic and the elements may be arranged in a different configuration. Further, a MRAM cell 180 may be manufactured as a discrete device, i.e., a single isolated device.

Each MRAM cell 180 includes a magnetic spin valve having at least two different resistive states depending on the alignment of magnetizations of different magnetic material layers. The magnetic spin valve is provided between a first electrode and a second electrode within each MRAM cell 180. Configurations of the MRAM cells 180 are described in detail in subsequent sections.

Figure 2A:
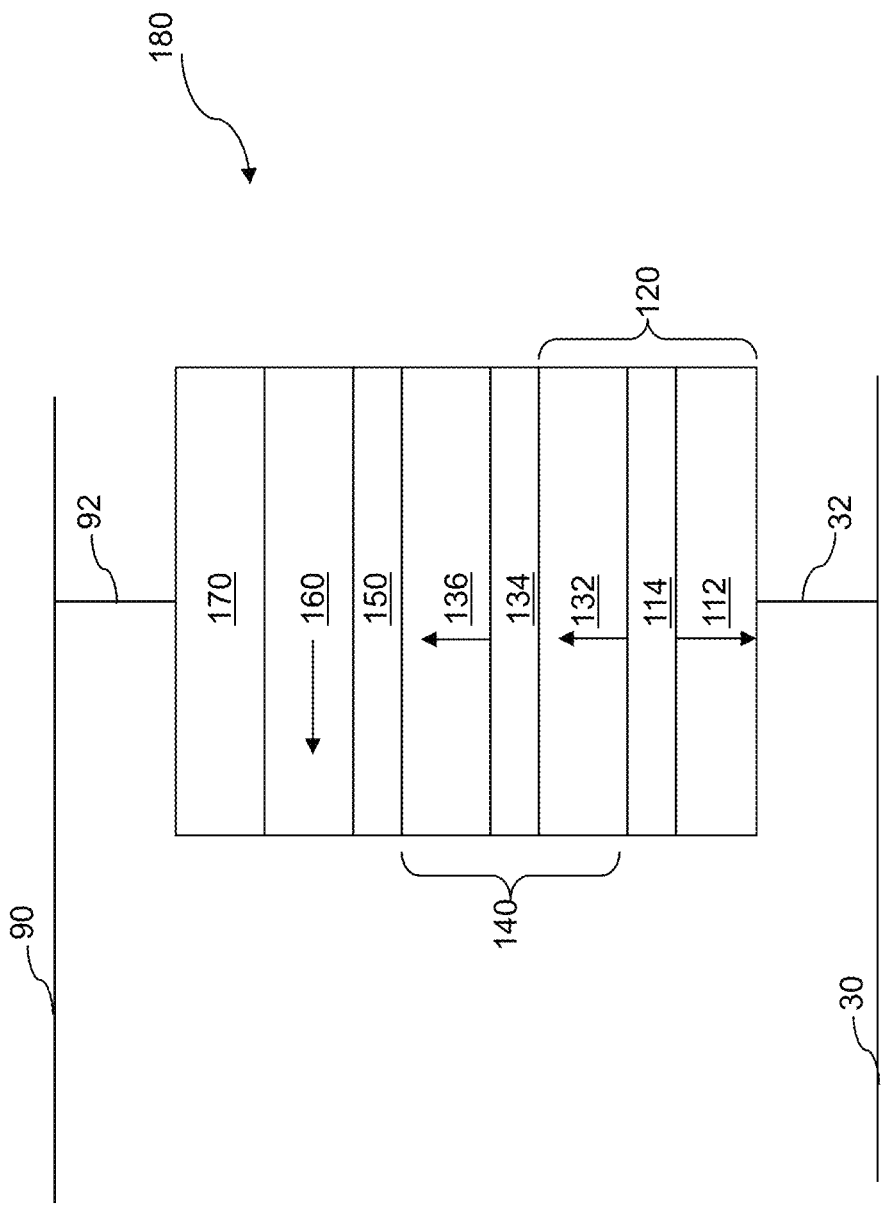
FIG. 2A illustrates a first configuration of a first exemplary STT MRAM cell according to a first embodiment of the present disclosure.

Referring to FIG. 2A, a first configuration of a first exemplary STT MRAM cell 180 according to a first embodiment is schematically illustrated. The STT MRAM cell 180 includes a spin valve 140. The spin valve 140 includes a reference layer 132 having a fixed vertical magnetization, a nonmagnetic metallic barrier layer 134 located between the reference layer 132 and the free layer 136. In one embodiment, the reference layer 132 is located below the nonmagnetic metallic barrier layer 134, while the free layer 136 is located above the nonmagnetic nonmagnetic barrier layer 134. However, in other embodiments, the reference layer 132 is located above the nonmagnetic barrier layer 134, while the free layer 136 is located below the nonmagnetic barrier layer 134, or the reference layer 132 and the free layer 136 may be located on opposite lateral sides nonmagnetic barrier layer 134. In one embodiment, the reference layer 132 and the free layer 136 have respective positive uniaxial magnetic anisotropy.

Generally, a magnetic thin film has magnetic energy per unit volume that depends on the orientation of the magnetization of the magnetic material of the magnetic thin film. The magnetic energy per unit volume can be approximated by a polynomial of the angle $\theta$ (or of $\sin^2 \theta$) between the direction of the magnetization and the vertical axis that is perpendicular to the plane of the magnetic thin film (such as a top surface or a bottom surface of the magnetic thin film) and the azimuthal angle $\phi$ between the direction of magnetization and a fixed vertical plane that is perpendicular to the plane of the magnetic thin film. The first and second order terms for the magnetic energy per unit volume as a function of $\sin^2 \theta$ includes $K_1 \sin^2 \theta + K_2 \sin^4 \theta$. When $K_1$ is negative and $K_2$ is less than $-K_1/2$, the function $K_1 \sin^2 \theta + K_2 \sin^4 \theta$ has a minimum when $\theta$ is at $\pi/2$. If the magnetic anisotropy energy as a function of $\theta$ has a minimum only when $\theta$ is at $\pi/2$, the magnetization of the magnetic film is entirely within the plane of the film, and the film is said to have "negative magnetic anisotropy." If the magnetic anisotropy energy as a function of $\theta$ has a minimum only when $\theta$ is at 0 or $\pi$, the magnetization of the magnetic film is perpendicular to the plane of the film, and the film is said to have "positive magnetic anisotropy." A thin crystalline magnetic film having positive magnetic anisotropy has a magnetization that is perpendicular to the plane of the thin crystalline magnetic film, i.e., perpendicular to the two directions along which the thin crystalline magnetic film laterally extends. A thin crystalline magnetic film having negative magnetic anisotropy has a magnetization within the plane of the thin crystalline magnetic film, i.e., parallel to the two directions along which the thin crystalline magnetic film laterally extends.

The configuration in which the reference layer 132 and the free layer 136 have respective positive uniaxial magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the reference layer 132, and an antiparallel state in which the free layer 136 has a magnetization (e.g., magnetization direction) that is antiparallel to the fixed vertical magnetization (e.g., magnetization direction) of the reference layer 132.

The reference layer 132 can include either a Co/Ni or Co/Pt multilayer structure. The reference layer 132 can additionally include a thin non-magnetic layer comprised of tantalum having a thickness of 0.2 nm~0.5 nm and a thin CoFeB layer (having a thickness in a range from 0.5 nm to 2 nm). The nonmagnetic metallic barrier layer 134 can include a metallic barrier material such as Cu, Ag, AgSn, Cr, Ru, Ta, TaN, and CuN. The thickness of the nonmagnetic metallic barrier layer 134 can be 0.7 nm to 1.3 nm, such as about 1 nm. The free layer 136 can include alloys of one or more of Fe, Co, and/or Ni, such as CoFeB, at a composition that provides positive uniaxial magnetic anisotropy.

In one embodiment, the reference layer 132 may be provided as a component within a synthetic antiferromagnetic structure (SAF structure) 120. The SAF structure 120 can include the reference layer 132, a fixed ferromagnetic layer 112 having a magnetization that is antiparallel to the fixed vertical magnetization, and an antiferromagnetic coupling layer 114 located between the reference layer 132 and the fixed ferromagnetic layer 112 facing the first side of the reference layer 132 opposite to the second side of the reference layer 132 which faces the nonmagnetic barrier layer 134. The antiferromagnetic coupling layer 114 has a thickness that induces an antiferromagnetic coupling between the reference layer 132 and the fixed ferromagnetic layer 112. In other words, the antiferromagnetic coupling layer 114 can lock in the antiferromagnetic alignment between the magnetization of the reference layer 132 and the magnetization of the fixed ferromagnetic layer 112 to lock in place the magnetizations of the reference layer 132 and the magnetization of the fixed ferromagnetic layer 112. In one embodiment, the antiferromagnetic coupling layer can include ruthenium and can have a thickness in a range from 0.3 nm to 1 nm.

A first nonmagnetic metallic spacer layer 150 is provided over the second side of the free layer 136 opposite to the first side of the free layer 136 which faces the nonmagnetic metallic barrier layer 134. The first nonmagnetic metallic spacer layer 150 includes a nonmagnetic metallic material such as Cu, Ag, AgSn, Cr, Ta, Ru, TaN, or CuN. In one embodiment, the first nonmagnetic metallic spacer layer 150 can include an electrically conductive metallic material. The thickness of the first nonmagnetic metallic spacer layer 150 can be in a range from 0.2 nm to 2 nm, although lesser and greater thicknesses can also be employed.

A negative-magnetic-anisotropy assist layer 160 can be provided over the first nonmagnetic metallic spacer layer 150 and over the second side of the free layer 136. The negative-magnetic-anisotropy assist layer 160 can have negative magnetic anisotropy with a sufficiently negative $K_1$ value to provide an in-plane magnetization for the negative-magnetic-anisotropy assist layer 160. The in-plane magnetization is a magnetization located within a horizontal plane in FIG. 2A that is perpendicular to the fixed vertical magnetization of the reference layer 132.

In one embodiment, the hard magnetization axis is parallel to the direction normal to a major surface of the negative-magnetic-anisotropy assist layer 160 (i.e., the axis is perpendicular to the plane of the layer 160 and parallel to fixed vertical magnetization of the reference layer 132), whereas the easy magnetization plane is parallel to the plane of the negative-magnetic-anisotropy assist layer 160 (i.e., the easy magnetization plane is perpendicular to the fixed vertical magnetization of the reference layer 132 in FIG. 2A). In one embodiment, within the plane (i.e., the easy magnetization plane) of the negative-magnetic-anisotropy assist layer 160, there is no easy axis direction. The negative-magnetic-anisotropy assist layer 160 is spin-coupled with the free layer 136 through the first nonmagnetic spacer layer 150.

In one embodiment, the azimuthally-dependent component of the magnetic anisotropy of the negative-magnetic-anisotropy assist layer 160 may be zero or insignificant compared to the thermal energy at room temperature, i.e., $k_B T$ in which $k_B$ is the Boltzmann constant and T is 297.15 Kelvin (which is the room temperature). For example, the maximum variation of the magnetic anisotropy per unit volume around a vertical axis that is parallel to the fixed vertical magnetization of the reference layer 132 can be less than ½ times the thermal energy at room temperature. In such cases, the magnetization of the negative-magnetic-anisotropy assist layer 160 is free to precess within the horizontal plane that is parallel to the interface between the first nonmagnetic metallic spacer layer 150 and the negative-magnetic-anisotropy assist layer 160 upon application of electrical current through the negative-magnetic-anisotropy assist layer 160. In one embodiment, the magnetic energy of the negative-magnetic-anisotropy assist layer 160 may be invariant under rotation of the magnetization of the negative-magnetic-anisotropy assist layer 160 within the horizontal plane.

In one embodiment, the negative-magnetic-anisotropy assist layer 160 comprises a homogeneous negative magnetic anisotropy material. As used herein, a "homogeneous" material refers to a material having a uniform material composition throughout. In one embodiment, the negative-magnetic-anisotropy assist layer 160 comprises, and/or consists essentially of, a cobalt-iridium alloy. The material composition of the cobalt-iridium alloy can be selected to provide negative magnetic anisotropy. In one embodiment, the cobalt-iridium alloy can include cobalt atoms at an atomic concentration in a range from 60% to 98%, such as from 70% to 90%, for example 80%, and iridium atoms at the atomic concentration in a range from 40% to 2%, such as from 30% to 10%, for example 20%. In one embodiment, the cobalt-iridium alloy contains only cobalt, iridium and unavoidable impurities. In another embodiment, up to 5 atomic percent of elements other than cobalt and iridium may be added to the alloy. In an illustrative example, a cobalt-iridium alloy having a composition of $Co_{0.8}Ir_{0.2}$ has a $K_1$ value of about $-0.6 \times 10^6$ J/m$^3$. In another embodiment, the negative-magnetic-anisotropy assist layer 160 comprises, and/or consists essentially of, a cobalt-iron alloy. The material composition of the cobalt-iron alloy can be selected to provide negative magnetic anisotropy. In one embodiment, the cobalt-iron alloy can include cobalt atoms at an atomic concentration in a range from 80% to 99.8%, such as from 90% to 99.5%, such as 99%, and iron atoms at the atomic concentration in a range from 20% to 0.2%, such as from 10% to 0.5%, for example 1%. In an illustrative example, a cobalt-iron alloy having a composition of $Co_{0.99}Fe_{0.1}$ has a $K_1$ value of about $-0.99 \times 10^6$ J/m$^3$. The thickness of the negative-magnetic-anisotropy assist layer 160 can be in a range from 1 nm to 10 nm, such as from 1.5 nm to 6 nm, although lesser and greater thicknesses can also be employed.

In one embodiment, a nonmagnetic capping layer 170 can be located over the negative-magnetic-anisotropy assist layer 160. The nonmagnetic capping layer 170 can include a non-magnetic, electrically conductive (e.g., metallic) material, such as W, Ti, Ta, WN, TiN, TaN, Ru, and Cu. The thickness of the nonmagnetic capping layer 170 can be in a range from 1 nm to 20 nm, although lesser and greater thicknesses can also be employed.

The layer stack including the material layers from the SAF structure 120 to the nonmagnetic capping layer 170 can be deposited upward or downward, i.e., from the SAF structure 120 toward the nonmagnetic capping layer 170 or from the nonmagnetic capping layer 170 toward the SAF structure 120. The layer stack can be formed as a stack of continuous layers, and can be subsequently patterned into discrete patterned layer stacks for each MRAM cell 180.

MRAM cell 180 can include a first terminal 92 that is electrically connected to or comprises a portion of a bit line 90 (shown in FIG. 1) and second terminal 32 that is electrically connected to or comprises a portion of a word line 30 (shown in FIG. 1). The location of the first and second terminals may be switched such that the first terminal is electrically connected to the SAF structure 120 and the second terminal is electrically connected to the capping layer 170.

Optionally, each MRAM cell 180 can include a dedicated steering device, such an access transistor or diode configured to activate a respective discrete patterned layer stack (120, 140, 150, 160, 170) upon application of a suitable voltage to the steering device. The steering device may be electrically connected between the patterned layer stack and one of the respective word lines 30 or bit lines 90 of the respective MRAM cell 180.

In one embodiment, the polarity of the voltage applied to the first terminal 92 can be changed depending on the polarity of the magnetization state to be programmed in the free layer 136. For example, a voltage of a first polarity can be applied to the first terminal 92 (with respect to the second terminal 32) during a transition from an antiparallel state to a parallel state, and a voltage of a second polarity (which is the opposite of the first polarity) can be applied to the first terminal 92 during a transition from a parallel state to an antiparallel state. Further, variations in the circuitry for activating the discrete patterned layer stack (120, 140, 150, 160, 170) are also contemplated herein.

The magnetization direction of the free layer 136 can be flipped (i.e., from upward to downward or vice versa) by flowing electrical current through the discrete patterned layer stack (120, 140, 150, 160, 170). The magnetization of the free layer 136 can precess around the vertical direction (i.e., the direction of the flow of the electrical current) during the programming process until the direction of the magnetization flips by 180 degrees, at which point the flow of the electrical current stops. In one embodiment, the magnetization of the negative-magnetic-anisotropy assist layer 160 can rotate freely around a vertical axis that is parallel to the fixed magnetization direction of the reference layer 132 while electrical current flows through the discrete patterned layer stack (120, 140, 150, 160, 170). This configuration allows the negative-magnetic-anisotropy assist layer 160 to provide an initial non-zero torque to the magnetization of the free layer 136 during an initial phase of precession of the magnetization of the free layer 136 around the vertical axis that is parallel to the fixed vertical magnetization of the reference layer 132 upon initiation of flow of electrical current through the MRAM cell 180.

In one embodiment, the MRAM cell 180 can be configured to provide coupling between the in-plane magnetization of the negative-magnetic-anisotropy assist layer 160 and the magnetization of the free layer 136 during precession of the magnetization of the free layer 136 around a vertical axis that is parallel to the fixed vertical magnetization of the reference layer 132, and to provide synchronized precession of the in-plane magnetization of the negative-magnetic-anisotropy assist layer 160 and the magnetization of the free layer 136 while electrical current flows through the MRAM cell 180.

Due to the negative magnetic anisotropy, in one embodiment, the in-plane magnetization of the negative-magnetic-anisotropy assist layer 160 can provide an initial torque to the free layer to facilitate the initiation of switching of the free layer 136. Once the free layer 136 precession starts, the free layer 136 can provide a spin torque to the negative-magnetic-anisotropy assist layer 160 to cause the negative-magnetic-anisotropy assist layer 160 magnetization to precess as well. This negative-magnetic-anisotropy assist layer 160 precession can in turn further assist the switching of the free layer 136. The embodiment negative-magnetic-anisotropy assist layer 160 which has an in-plane easy magnetization plane but which lacks a fixed easy axis direction, is more efficient than a prior art assist layer where the assist layer's magnetization direction (e.g., easy axis) is fixed.

Figure 2B:
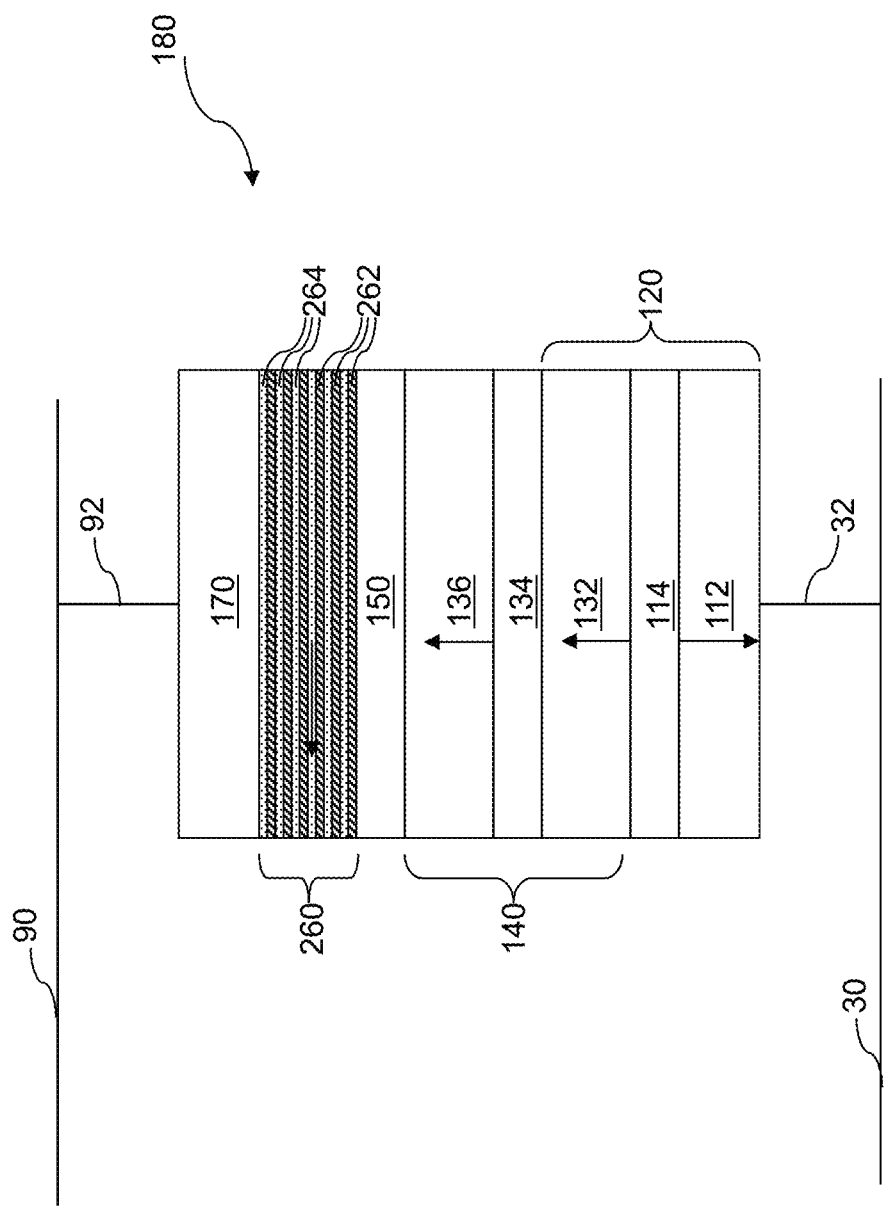
FIG. 2B illustrates a second configuration of the first exemplary STT MRAM cell according to a first embodiment of the present disclosure.

Referring to FIG. 2B, a second configuration of the first exemplary spin-transfer torque MRAM cell 180 can be derived from the first configuration of the first exemplary spin-transfer torque MRAM cell 180 of FIG. 2A by replacing the negative-magnetic-anisotropy assist layer 160 having a homogeneous material composition with a negative-magnetic-anisotropy assist layer 260 including a multilayer stack (262, 264). The multilayer stack (262, 264) can include multiple repetitions of a first magnetic material layer 262 and a second magnetic material layer 264. The first magnetic material layer 262 can include, and/or can consist essentially of, a first magnetic material. The second magnetic material layer 264 can include, and/or can consist essentially of, a second magnetic material.

The composition and the thickness of each first magnetic material layer 262 and the composition and the thickness of each second magnetic material layer 264 can be selected such that the multilayer stack (262, 264) provides an in-plane magnetization, i.e., a magnetization that is perpendicular to the fixed magnetization direction of the reference layer 132 (i.e., an easy magnetization plane that is perpendicular to the fixed magnetization direction of the reference layer 132 without an easy magnetization axis). The negative-magnetic-anisotropy assist layer 260 can have negative magnetic anisotropy with a sufficiently negative $K_1$ value to provide the in-plane magnetization for the negative-magnetic-anisotropy assist layer 260.

In one embodiment, the azimuthally-dependent component of the magnetic anisotropy of the negative-magnetic-anisotropy assist layer 260 may be zero or insignificant compared to the thermal energy at room temperature. For example, the maximum variation of the magnetic anisotropy per unit volume around a vertical axis that is parallel to the fixed vertical magnetization of the reference layer 132 can be less than ½ times the thermal energy at room temperature. In such cases, the magnetization of the negative-magnetic-anisotropy assist layer 260 is free to precess within the plane that is parallel to the interface between the first nonmagnetic spacer layer 150 and the negative-magnetic-anisotropy assist layer 260 upon application of electrical current through the negative-magnetic-anisotropy assist layer 260. In one embodiment, the magnetic energy of the negative-magnetic-anisotropy assist layer 260 may be invariant under rotation of the magnetization of the negative-magnetic-anisotropy assist layer 260 within the horizontal plane.

In one embodiment, the first magnetic material layers 262 comprise cobalt, and the second magnetic material layers 264 comprise iron. In one embodiment, the first magnetic material layers 262 consist essentially of cobalt, and the second magnetic material layers 264 consist essentially of iron. The thickness of each first magnetic material layer 262 can be in a range from 0.3 nm to 1 nm, and the thickness of each second magnetic material layer 264 can be in a range from 0.3 nm to 1 nm. The total number of repetitions (i.e., the total number of pairs of a first magnetic material layer 262 and a second magnetic material layer 264) within the negative-magnetic-anisotropy assist layer 260 can be in a range from 2 to 20, such as from 4 to 10. In one embodiment, the multilayer stack (262, 264) comprises a periodic repetition of a unit layer stack that includes a first magnetic material layer 262 and a second magnetic material layer 264. In an illustrative example, a cobalt-iron multilayer stack including repetitions of a unit layer stack consisting of a cobalt layer and an iron layer having the same thickness can have a K1 value of about $-1.1 \times 10^6$ J/m$^3$.

Referring to FIG. 2C, a third configuration of the first exemplary spin-transfer torque MRAM cell 180 can be derived from the first configuration of the first exemplary spin-transfer torque MRAM cell 180 of FIG. 2A by inserting a second nonmagnetic metallic spacer layer 190 and a pinned magnetization layer 192 between the negative-magnetic-anisotropy assist layer 160 and the nonmagnetic capping layer 170.

The second nonmagnetic metallic spacer layer 190 can be located on the negative-magnetic-anisotropy assist layer 160 on the opposite side from the first nonmagnetic metallic spacer layer 150. The second nonmagnetic metallic spacer layer 190 includes a nonmagnetic metallic material such as Cu, Ag, AgSn, Cr, Ru, Ta, TaN, or CuN. In one embodiment, the second nonmagnetic metallic spacer layer 190 can include an electrically conductive (e.g., metallic) material. The thickness of the second nonmagnetic metallic spacer layer 190 can be in a range from 0.2 nm to 2 nm, although lesser and greater thicknesses can also be employed. The second nonmagnetic metallic spacer layer 190 can include the same material as, or can include a material different from, the material of the first nonmagnetic metallic spacer layer 150.

The pinned magnetization layer 192 is a magnetic layer which has a positive uniaxial magnetic anisotropy. In other words, the value of $K_1$ is positive and the term $K_1 \sin^2 \theta$ dominates all other higher order terms and terms depending on $\sin(n\phi)$ (or $\cos(n\phi)$) in the magnetic anisotropy energy per volume for the material of the pinned magnetization layer 192. The positive uniaxial magnetic anisotropy of the pinned magnetization layer 192 provides a magnetization that is parallel or antiparallel to the fixed vertical magnetization of the reference layer 132. In one embodiment, the value of $K_1$ for the pinned magnetization layer 192 can be greater than the value of $K_1$ for the free layer 136 such that the magnetization of the pinned magnetization layer 192 stays pinned along the vertical direction, i.e., perpendicular to the interfaces among the various layers of the discrete patterned layer stack (120, 140, 150, 160, 190, 192, 170), during programming of the MRAM cell 180. The magnetization of the pinned magnetization layer 192 may remain parallel to, or antiparallel to, the magnetization of the reference layer 132.

In one embodiment, the pinned magnetization layer 192 can include either a Co/Ni or Co/Pt multilayer structure. The pinned magnetization layer 192 can additionally include a thin non-magnetic layer comprised of tantalum having a thickness of 0.2 nm~0.5 nm and a thin CoFeB layer (having a thickness in a range from 0.5 nm to 2 nm). The pinned magnetization layer 192 can cause the in-plane magnetization of the negative-magnetic-anisotropy assist layer 160 to oscillate. The oscillation of the in-plane magnetization of the negative-magnetic-anisotropy assist layer 160 can produce a rotating spin torque on the magnetization of the free layer 136 during programming, and thus, can help the switching of the magnetization of the free layer 136 with a lower electrical current through the discrete patterned layer stack (120, 140, 150, 160, 190, 192, 170). In one embodiment, the combination of the magnetization of the pinned magnetization layer 192 and the negative-magnetic-anisotropy assist layer 160 applies a non-horizontal and non-vertical magnetic field (i.e., a field which is neither parallel to nor perpendicular to the direction of the magnetization of the reference layer 132) on the magnetization of the free layer 136 to reduce the magnitude of the required electrical current through the discrete patterned layer stack (120, 140, 150, 160, 190, 192, 170) during switching of the magnetization of the free layer 136.

Referring to FIG. 2D, a fourth configuration of the first exemplary spin-transfer torque MRAM cell 180 can be derived from the third configuration of the exemplary spin-transfer torque MRAM cell 180 of FIG. 2A by replacing the negative-magnetic-anisotropy assist layer 160 having a homogeneous material composition with the negative-magnetic-anisotropy assist layer 260 containing the multilayer stack (262, 264) that includes multiple repetitions of a first magnetic material layer 262 and a second magnetic material layer 264 that was described above with respect to FIG. 2B.

Referring to all configurations of the exemplary spin-transfer torque MRAM cell 180 illustrated in FIGS. 1-2D, the exemplary spin-transfer torque MRAM cell 180 can be programmed and read individually. Reading, i.e., sensing, the magnetization state of the free layer 136 can be performed by applying a read bias voltage across the first terminal 92 and the second terminal 32 of a selected discrete patterned layer stack {120, 140, 150, (160 or 260), 170} or {120, 140, 150, (160 or 260), (190, 192), 170}. The parallel or antiparallel alignment between the magnetization of the free layer 136 and the reference layer 132 determines the electrical resistance of the selected discrete patterned layer stack in each MRAM cell 180, and thus, determines the magnitude of the electrical current that flows between the first terminal 92 and the second terminal 32. The magnitude of the electrical current can be sensed to determine the magnetization state of the free layer 136 and the data encoded by the detected magnetization state.

Programming of the first exemplary spin-transfer torque MRAM cell 180 to the opposite magnetization state for the free layer 136 can be performed by flowing electrical current through the selected discrete patterned layer stack {120, 140, 150, (160 or 260), 170} or {120, 140, 150, (160 or 260), (190, 192), 170} and by inducing the flipping, i.e., the switching, of the direction of the magnetization of the free layer 136. Specifically, electrical current can be flowed through a selected discrete patterned layer stack which includes a spin valve 140, a first nonmagnetic metallic spacer layer 150, and a negative-magnetic-anisotropy assist layer (160 or 260). The in-plane magnetization of the negative-magnetic-anisotropy assist layer (160 or 260) provides an initial non-zero torque to the magnetization of the free layer 136 during an initial phase of precession of the magnetization of the free layer 136 around a vertical axis that is parallel to the fixed vertical magnetization of the reference layer 132 upon initiation of flow of the electrical current through the spin valve 140, the first nonmagnetic metallic spacer layer 150, and the negative-magnetic-anisotropy assist layer (160 or 260).

In one embodiment, the in-plane magnetization of the negative-magnetic-anisotropy assist layer (160 or 260) couples with a magnetization of the free layer 136 during precession of the magnetization of the free layer 136 around the vertical axis that is parallel to the fixed vertical magnetization of the reference layer 132 to provide synchronized precession of the in-plane magnetization of the negative-magnetic-anisotropy assist layer (160 or 260) and the magnetization of the free layer 136 while electrical current flows through the MRAM cell 180. In one embodiment, the in-plane magnetization of the negative-magnetic-anisotropy assist layer (160 or 260) and the magnetization of the free layer 136 may remain within the same rotating vertical plane during the switching of the magnetization of the free layer 136. The coupling between the horizontal (in-plane) component of the magnetization of the free layer 136 and the in-plane magnetization of the negative-magnetic-anisotropy assist layer (160 or 260) may be antiferromagnetic or ferromagnetic.

Referring to FIG. 3A, a first configuration of a second exemplary MRAM cell according to a second embodiment is schematically illustrated. The first configuration of the second exemplary MRAM cell 180 can be derived from the first configuration of the first exemplary MRAM cell 180 of FIG. 2A by replacing the negative-magnetic-anisotropy assist layer 160 with a magnetic assist layer stack 460.

The magnetic assist layer stack 460 includes a first magnetic assist layer 162, an antiferromagnetic coupling spacer layer 164, and a second magnetic assist layer 166 from one side to another. The first magnetic assist layer 162 can be provided on the first nonmagnetic metallic spacer layer 150. The first magnetic assist layer 162 includes a first magnetic material having a first magnetic anisotropy. In one embodiment, the first magnetic assist layer 162 can have a first negative magnetic anisotropy with a sufficiently negative $K_1$ value to provide a first in-plane magnetization for the first magnetic assist layer 162. The in-plane magnetization is a magnetization located within a horizontal plane that is perpendicular to the fixed vertical magnetization direction of the reference layer 132.

In one embodiment, the azimuthally-dependent component of the first magnetic anisotropy of the first magnetic assist layer 162 may be zero or insignificant compared to the thermal energy at room temperature, i.e., $k_B T$ in which $k_B$ is the Boltzmann constant and T is 297.15 Kelvin (which is the room temperature). For example, the maximum variation of the magnetic anisotropy energy per unit volume around a vertical axis that is parallel to the fixed vertical magnetization of the reference layer 132 can be less than ½ times the thermal energy at room temperature. In such cases, the magnetization of the first magnetic assist layer 162 is free to precess within the horizontal plane that is parallel to the interface between the first nonmagnetic metallic spacer layer 150 and the first magnetic assist layer 162 upon application of electrical current through the first magnetic assist layer 162. In one embodiment, the magnetic energy of the first magnetic assist layer 162 may be invariant under rotation of the magnetization of the first magnetic assist layer 162 within the horizontal plane.

In one embodiment, a material having a negative magnetic anisotropy, such as the first magnetic assist layer 162, has a hard magnetization axis that parallel to the direction normal to a major surface of the layer (i.e., the axis is perpendicular to the plane of the layer and parallel to fixed vertical magnetization direction of the reference layer 132), whereas the easy magnetization plane is parallel to the plane of the layer (i.e., the easy magnetization plane is perpendicular to the fixed vertical magnetization direction of the reference layer 132 in FIG. 3A). In one embodiment, there is no easy axis direction within the easy magnetization plane.

In one embodiment, the first magnetic assist layer 162 comprises a homogeneous negative magnetic anisotropy material. As used herein, a "homogeneous" material refers to a material having a uniform material composition throughout. In one embodiment, the first magnetic assist layer 162 comprises, and/or consists essentially of, a cobalt-iridium alloy. The material composition of the cobalt-iridium alloy can be selected to provide negative magnetic anisotropy. In one embodiment, the cobalt-iridium alloy can include cobalt atoms at an atomic concentration in a range from 60% to 98%, such as from 70% to 90%, for example 80%, and iridium atoms at the atomic concentration in a range from 40% to 2%, such as from 30% to 10%, for example 20%. In one embodiment, the cobalt-iridium alloy contains only cobalt, iridium and unavoidable impurities. In another embodiment, up to 5 atomic percent of elements other than cobalt and iridium may be added to the alloy. In an illustrative example, a cobalt-iridium alloy having a composition of $Co_{0.8}Ir_{0.2}$ has a $K_1$ value of about $-0.6 \times 10^6$ J/m³. In another embodiment, the first magnetic assist layer 162 comprises, and/or consists essentially of, a cobalt-iron alloy having a hexagonal crystal structure. The material composition of the cobalt-iron alloy can be selected to provide negative magnetic anisotropy. In one embodiment, the cobalt-iron alloy can include cobalt atoms at an atomic concentration in a range from 80% to 99.8%, such as from 90% to 99.5%, such as 99%, and iron atoms at the atomic concentration in a range from 20% to 0.2%, such as from 10% to 0.5%, for example 1%. In an illustrative example, a cobalt-iron alloy having a composition of $Co_{0.99}Fe_{0.1}$ has a $K_1$ value of about $-0.99 \times 10^6$ J/m³. The thickness of the first magnetic assist layer 162 can be in a range from 1 nm to 10 nm, such as from 1.5 nm to 6 nm, although lesser and greater thicknesses can also be employed.

In another embodiment, the first magnetic assist layer 162 comprises a multiplayer stack that includes multiple repetitions of a first magnetic material layer and a second magnetic material layer. The first magnetic material layer can include, and/or can consist essentially of, a first magnetic material. The second magnetic material layer can include, and/or can consist essentially of, a second magnetic material. The composition and the thickness of each first magnetic material layer and the composition and the thickness of each second magnetic material layer can be selected such that the multilayer stack provides an in-plane magnetization, i.e., a magnetization that is perpendicular to the fixed magnetization direction of the reference layer 132. The first magnetic assist layer 162 can have negative magnetic anisotropy with a sufficiently negative $K_1$ value to provide the first in-plane magnetization for the first magnetic assist layer 162.

In one embodiment, the first magnetic material layers comprise cobalt, and the second magnetic material layers comprise iron. In one embodiment, the first magnetic material layers consist essentially of cobalt, and the second magnetic material layers consist essentially of iron. The thickness of each first magnetic material layer can be in a range from 0.3 nm to 1 nm, and the thickness of each second magnetic material layer can be in a range from 0.3 nm to 1 nm. The total number of repetitions (i.e., the total number of pairs of a first magnetic material layer and a second magnetic material layer) within the first magnetic assist layer 162 can be in a range from 2 to 20, such as from 4 to 10. In one embodiment, the multilayer stack comprises a periodic repetition of a unit layer stack that includes a first magnetic material layer and a second magnetic material layer.

The antiferromagnetic coupling spacer layer 164 can be located between the first and second magnetic assist layers, such as on the first magnetic assist layer 162 on the opposite side of the first nonmagnetic metallic spacer layer 150, which is located between the free layer 136 and the first magnetic assist layer 162. The antiferromagnetic coupling spacer layer 164 comprises a metallic material that induces Ruderman-Kittel-Kasuya-Yosida (RKKY) coupling interaction between the first magnetic assist layer 152 and a second magnetic assist layer 166 that in one embodiment is located on the antiferromagnetic coupling spacer layer 164. In the RKKY coupling interaction, localized inner d- or f-shell electron spins that define the magnetization direction of a ferromagnetic metal layer interact through the conduction electrons in an intervening nonmagnetic material layer to define a direction of preferred magnetization direction in another ferromagnetic metal layer. The thickness of the antiferromagnetic coupling spacer layer 164 can be selected such that a second in-plane magnetization direction of a second magnetic assist layer 166 is antiparallel to the first in-plane magnetization direction of the first magnetic assist layer 162. In other words, the antiferromagnetic coupling spacer layer 164 can have a thickness within a range that provides antiferromagnetic coupling between a first magnetization direction of the first magnetic assist layer 162 and a second magnetization direction of the second magnetic assist layer 166. In one embodiment, the antiferromagnetic coupling spacer layer 164 comprises, or consists essentially of, ruthenium, and has a thickness within a range from 0.1 nm to 1.0 nm.

The second magnetic assist layer 166 can be provided on the antiferromagnetic coupling spacer layer 164. The second magnetic assist layer 166 includes a second magnetic material having second magnetic anisotropy, which can be the same as or different from the material of the first magnetic assist layer 162. In one embodiment, the second magnetic assist layer 166 can have a second negative magnetic anisotropy with a sufficiently negative $K_1$ value to provide a second in-plane magnetization direction for the second magnetic assist layer 166. The in-plane magnetization direction is a magnetization direction located within a horizontal plane that is perpendicular to the fixed vertical magnetization direction of the reference layer 132.

In one embodiment, the azimuthally-dependent component of the magnetic anisotropy of the second magnetic assist layer 166 may be zero or insignificant compared to the thermal energy at room temperature, i.e., $k_B T$ in which $k_B$ is the Boltzmann constant and T is 297.15 Kelvin (which is the room temperature). For example, the maximum variation of the magnetic anisotropy per unit volume around a vertical axis that is parallel to the fixed vertical magnetization of the reference layer 132 can be less than ½ times the thermal energy at room temperature. In such cases, the magnetization of the second magnetic assist layer 166 is free to precess within the horizontal plane that is parallel to the interface between the antiferromagnetic coupling spacer layer 164 and the second magnetic assist layer 166 upon application of electrical current through the second magnetic assist layer 166. In one embodiment, the magnetic energy of the second magnetic assist layer 166 may be invariant under rotation of the magnetization of the second magnetic assist layer 166 within the horizontal plane.

In one embodiment, the second magnetic assist layer 166 comprises a homogeneous negative magnetic anisotropy material. In one embodiment, the second magnetic assist layer 166 comprises, and/or consists essentially of, a cobalt-iridium alloy or a cobalt-iron alloy described with respect to the first magnetic assist layer 162. The material composition of the cobalt-iridium alloy can be selected to provide negative magnetic anisotropy. In one embodiment, the cobalt-iridium alloy can include cobalt atoms at an atomic concentration in a range from 20% to 80% and iridium atoms at the atomic concentration of the balance. The thickness of the second magnetic assist layer 166 can be in a range from 1 nm to 10 nm, such as from 1.5 nm to 6 nm, although lesser and greater thicknesses can also be employed.

In another embodiment, the second magnetic assist layer 166 comprises a multiplayer stack that includes multiple repetitions of a first magnetic material layer and a second magnetic material layer. The first magnetic material layer can include, and/or can consist essentially of, a first magnetic material. The second magnetic material layer can include, and/or can consist essentially of, a second magnetic material. The composition and the thickness of each first magnetic material layer and the composition and the thickness of each second magnetic material layer can be selected such that the multilayer stack provides an in-plane magnetization, i.e., a magnetization that is perpendicular to the fixed magnetization direction of the reference layer 132. The second magnetic assist layer 166 can have negative magnetic anisotropy with a sufficiently negative $K_1$ value to provide the second in-plane magnetization for the second magnetic assist layer 166.

In one embodiment, the first magnetic material layers comprise cobalt, and the second magnetic material layers comprise iron. In one embodiment, the first magnetic material layers consist essentially of cobalt, and the second magnetic material layers consist essentially of iron. The thickness of each first magnetic material layer can be in a range from 0.3 nm to 1 nm, and the thickness of each second magnetic material layer can be in a range from 0.3 nm to 1 nm. The total number of repetitions (i.e., the total number of pairs of a first magnetic material layer and a second magnetic material layer) within the second magnetic assist layer 166 can be in a range from 2 to 20, such as from 4 to 10. In one embodiment, the multilayer stack comprises a periodic repetition of a unit layer stack that includes a first magnetic material layer and a second magnetic material layer.

Generally, each of the first magnetic assist layer 162 and the second magnetic assist layer 166 can be independently selected from a homogeneous negative magnetic anisotropy material, and a multilayer stack including multiple repetitions of a first magnetic material layer and a second magnetic material layer. In one embodiment, each of the first magnetic assist layer 162 and the second magnetic assist layer 166 can be independently selected from a cobalt-iridium alloy, a cobalt-iron alloy having a hexagonal crystal structure and low iron content, or a multilayer stack including multiple repetitions of a unit stack of a cobalt layer and an iron layer. In one embodiment, at least one of the first magnetic assist layer 162 and the second magnetic assist layer 166 comprises a multilayer stack including a periodic repetition of a unit layer stack, and the unit layer stack includes the first magnetic material layer and the second magnetic material.

In one embodiment, the nonmagnetic metallic capping layer 170 described above with respect to FIG. 2A can be located over the second magnetic assist layer 166. The layer stack including the material layers from the SAF structure 120 to the nonmagnetic metallic capping layer 170 can be deposited upward or downward, i.e., from the SAF structure 120 toward the nonmagnetic metallic capping layer 170 or from the nonmagnetic metallic capping layer 170 toward the SAF structure 120. The layer stack can be formed as a stack of continuous layers, and can be subsequently patterned into discrete patterned layer stacks for each MRAM cell 180.

As in the first embodiment illustrated in FIG. 2A, the MRAM cell 180 of the second embodiment illustrated in FIG. 3A can include a first terminal 92 that is electrically connected to or comprises a portion of a bit line 90 (shown in FIG. 1) and second terminal 32 that is electrically connected to or comprises a portion of a word line 30 (shown in FIG. 1). The location of the first and second terminals may be switched such that the first terminal is electrically connected to the SAF structure 120 and the second terminal is electrically connected to the nonmagnetic metallic capping layer 170.

Optionally, each MRAM cell 180 can include a dedicated steering device, such an access transistor or diode configured to activate a respective discrete patterned layer stack (120, 140, 150, 162, 164, 166, 170) upon application of a suitable voltage to the steering device. The steering device may be electrically connected between the patterned layer stack and one of the respective word lines 30 or bit lines 90 of the respective MRAM cell 180.

In one embodiment, the polarity of the voltage applied to the first terminal 92 can be changed depending on the polarity of the magnetization state to be programmed in the free layer 136. For example, a voltage of a first polarity can be applied to the first terminal 92 (with respect to the second terminal 32) during a transition from an antiparallel state to a parallel state, and a voltage of a second polarity (which is the opposite of the first polarity) can be applied to the first terminal 92 during a transition from a parallel state to an antiparallel state. Further, variations in the circuitry for activating the discrete patterned layer stack (120, 140, 150, 162, 164, 166, 170) are also contemplated herein.

The magnetization direction of the free layer 136 can be flipped (i.e., from upward to downward or vice versa) by flowing electrical current through the discrete patterned layer stack (120, 140, 150, 162, 164, 166, 170). The magnetization direction of the free layer 136 can precess around the vertical direction (i.e., the direction of the flow of the electrical current) during the programming process until the direction of the magnetization flips by 180 degrees, at which point the flow of the electrical current stops.

The first magnetization direction of the first magnetic assist layer 162 and the second magnetization direction of the second magnetic assist layer 166 are free to precess around a vertical axis that is parallel to the fixed vertical magnetization direction of the reference layer 132 while maintaining an antiferromagnetic alignment therebetween upon application of electrical current through the first magnetic assist layer 162, the antiferromagnetic coupling spacer layer 164, and the second magnetic assist layer 166, e.g., during programming. The fixed vertical magnetization direction of the reference layer 132 maintains the same orientation upon application of electrical current through the reference layer 132.

During operation of the magnetic memory device, electrical current can be flowed through the spin valve 140, the first nonmagnetic metallic spacer layer 150, the first magnetic assist layer 162, the antiferromagnetic coupling spacer layer 164, and the second magnetic assist layer 166.

In one embodiment, the first magnetic assist layer 162, the antiferromagnetic coupling spacer layer 164, and the second magnetic assist layer 166 help keep the electron spin of the free layer more in plane to counteract the spin torque which tilts the electron spin out of the plane. Due to the antiferromagnetic coupling, the anti-ferromagnetic coupled assist film comprising the combination of the first magnetic assist layer 162, the antiferromagnetic coupling spacer layer 164, and the second magnetic assist layer 166 further favors single domains within each layer, thus maintaining a more coherent magnetization during the process of assisting the free layer 136 switching, which is more desired. One additional benefit of this embodiment is that the flux closure within the tri-layer assist film may minimize the stray field from the anti-ferromagnetic coupled assist film on the free layer 136, which will help improve the thermal stability and data retention of the MRAM cell 180.

In one embodiment, the combination of the first magnetic assist layer 162, the antiferromagnetic coupling spacer layer 164, and the second magnetic assist layer 166 is configured to provide an initial non-zero torque to a magnetization of the free layer 136 during an initial phase of precession of the magnetization of the free layer 136 around a vertical axis that is parallel to the fixed vertical magnetization direction of the reference layer 132 upon initiation of flow of electrical current through the MRAM cell 180. The MRAM cell 180 is configured to provide magnetic coupling between the magnetization direction of the free layer 136 and the first magnetization direction of the first magnetic assist layer 162 during precession of the magnetization direction of the free layer 136 around a vertical axis that is parallel to the fixed vertical magnetization direction of the reference layer 132, and to provide synchronized precession of the first magnetization direction of the first magnetic assist layer 162 and the magnetization direction of the free layer 136 while electrical current flows through the MRAM cell 180.

Figure 3B:
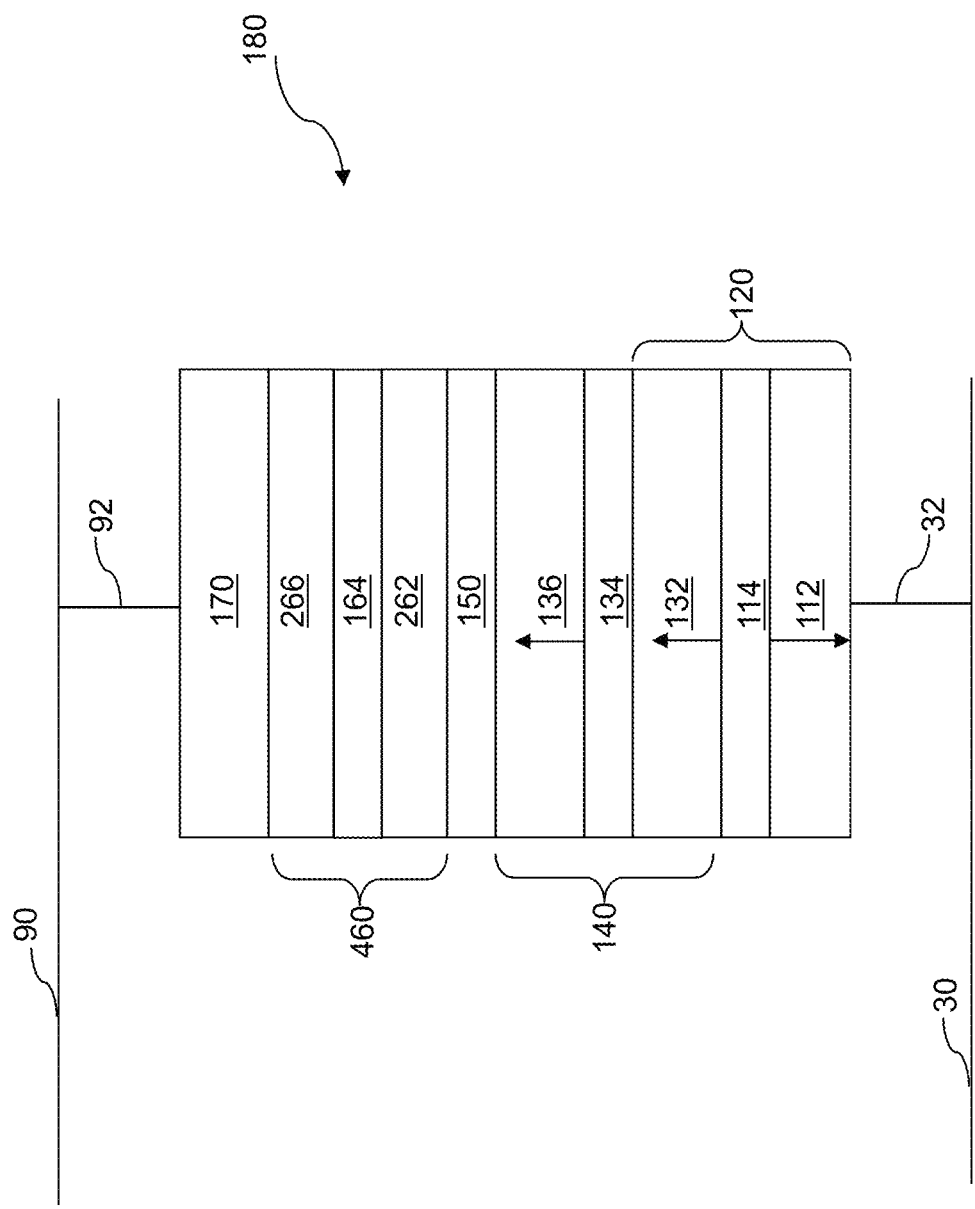
FIG. 3B illustrates a second configuration of the second exemplary STT MRAM cell according to a second embodiment of the present disclosure.

Referring to FIG. 3B, a second configuration of the second exemplary spin-transfer torque MRAM cell 180 can be derived from the first configuration of the second exemplary spin-transfer torque magnetic memory device illustrated in FIG. 3A by replacing the first magnetic assist layer 162 having the first in-plane magnetization with a first magnetic assist layer 262 including a first ferromagnetic material having no uniaxial magnetic anisotropy, and by replacing the second magnetic assist layer 166 having the second in-plane magnetization with a second magnetic assist layer 266 including a second ferromagnetic material having no uniaxial magnetic anisotropy. In one embodiment, the first and second magnetic assist layers (262, 266) can have a non-uniaxial magnetic anisotropy. As used herein, a "non-uniaxial magnetic anisotropy" refers to a magnetic anisotropy in which the minimum of the magnetic anisotropy energy per volume does not occur at the direction of $\theta=0$, $\theta=\pi$, or $\theta=\pi/2$ for all values of $\phi$. In other words, the orientation of the magnetization in a magnetic film having a non-uniaxial magnetic anisotropy is not a vertical direction that is perpendicular to the plane of a magnetic film or the set of all in-plane directions.

The thickness of the antiferromagnetic coupling spacer layer 164 is selected to provide an antiferromagnetic coupling between the first magnetization of the first magnetic assist layer 262 and the second magnetization with a second magnetic assist layer 266. Thus, the first magnetization of the first magnetic assist layer 262 and the second magnetization of the second magnetic assist layer 266 can be antiferromagnetically coupled. Further, the variations in the magnetic anisotropy energy per volume as a function of spatial orientations of the first and second magnetizations (which remain antiparallel to each other) can be on par with, or less than, the thermal energy at room temperature, i.e., $k_B T$ in which T is 297.15 Kelvin.

Each of the first magnetic assist layer 262 and the second magnetic assist layer 266 comprises a respective soft magnetic material having no uniaxial magnetic anisotropy, which may be the same or different. In one embodiment, each of the first magnetic assist layer 262 and the second magnetic assist layer 266 comprises, and/or consists essentially of, a respective material selected from a CoFe alloy having more than 40 atomic percent iron, such as 45 to 70 atomic percent iron and balance cobalt or an NiFe alloy.

The magnetization direction of the free layer 136 can be flipped (i.e., from upward to downward or vice versa) by flowing electrical current through the discrete patterned layer stack (120, 140, 150, 262, 164, 266, 170). The magnetization direction of the free layer 136 can precess around the vertical direction (i.e., the direction of the flow of the electrical current) during the programming process until the direction of the magnetization direction flips by 180 degrees, at which point the flow of the electrical current stops.

The magnetization direction of the free layer 136 can be programmed by flowing electrical current through the discrete patterned layer stack (120, 140, 150, 262, 164, 266, 170), e.g., from a parallel state that is parallel to the fixed vertical magnetization direction of the reference layer 132 to an antiparallel state that is antiparallel to the fixed magnetization direction of the reference layer 132 or vice versa. The first magnetization direction of the first magnetic assist layer 262 and the second magnetization direction of the second magnetic assist layer 266 are free to precess around a vertical axis that is parallel to the fixed vertical magnetization direction of the reference layer 132 at an angle between 0 degree and 180 degrees with respect to the vertical axis while maintaining an antiferromagnetic alignment therebetween upon application of electrical current through the first magnetic assist layer 262, the antiferromagnetic coupling spacer layer 164, and the second magnetic assist layer 266, e.g., during programming. The tilt angles of the first magnetization direction of the first magnetic assist layer 262 and the second magnetization direction of the second magnetic assist layer 266 during programming is synchronized with the tilt angle of the magnetization direction of the free layer 136 as the tilt angle changes from 0 degrees to 180 degrees or from 180 degrees to 0 degrees with respect to the vertical axis during programming of the MRAM cell 180. The fixed vertical magnetization direction of the reference layer 132 maintains the same orientation upon application of electrical current through the reference layer 132.

During operation of the magnetic memory device, electrical current can be flowed through the spin valve 140, the first nonmagnetic metallic spacer layer 150, the first magnetic assist layer 262, the antiferromagnetic coupling spacer layer 164, and the second magnetic assist layer 266. The combination of the first magnetic assist layer 262, the antiferromagnetic coupling spacer layer 164, and the second magnetic assist layer 266 is configured to provide an initial non-zero torque to a magnetization direction of the free layer 136 during an initial phase of precession of the magnetization direction of the free layer 136 around a vertical axis that is parallel to the fixed vertical magnetization direction of the reference layer 132 upon initiation of flow of electrical current through the MRAM cell 180. The MRAM cell 180 is configured to provide magnetic coupling between the magnetization direction of the free layer 136 and the first magnetization direction of the first magnetic assist layer 262 during precession of the magnetization direction of the free layer 136 around a vertical axis that is parallel to the fixed vertical magnetization direction of the reference layer 132, and to provide synchronized precession of the first magnetization direction of the first magnetic assist layer 262 and the magnetization direction of the free layer 136 while electrical current flows through the MRAM cell 180.

Figure 3C:
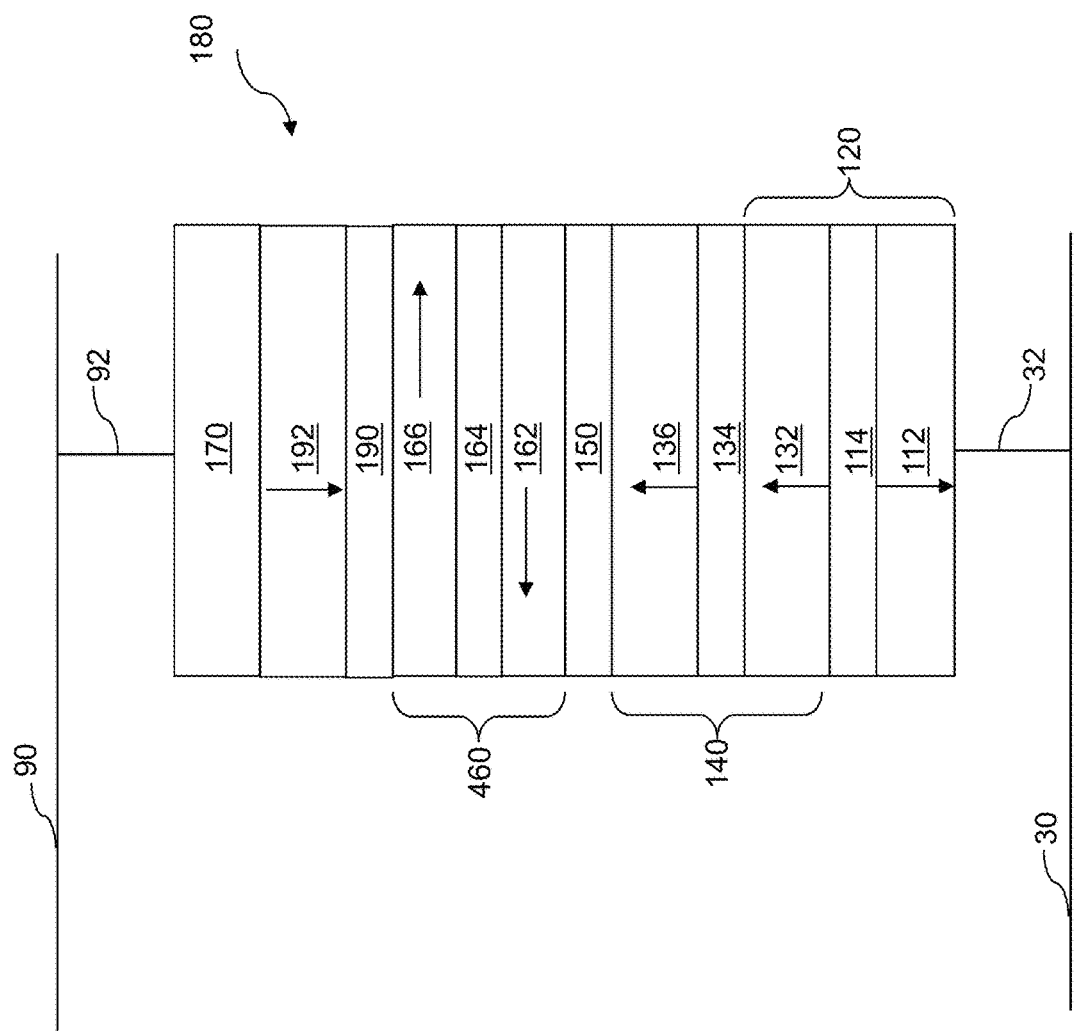
FIG. 3C illustrates a third configuration of the second exemplary STT MRAM cell according to the second embodiment of the present disclosure.

Referring to FIG. 3C, a third configuration of the second exemplary spin-transfer torque MRAM cell 180 can be derived from the first configuration of the second exemplary spin-transfer torque MRAM cell 180 of FIG. 3A by inserting a second nonmagnetic metallic spacer layer 190 and a pinned magnetization layer 192 between the second magnetic assist layer 166 and the nonmagnetic capping layer 170.

The second nonmagnetic metallic spacer layer 190 can be located on the second magnetic assist layer 166 on the opposite side of the antiferromagnetic coupling spacer layer 164. The second nonmagnetic metallic spacer layer 190 includes a nonmagnetic material such as Cu, Ag, AgSn, Cr, Ru, Ta, TaN, or CuN. In one embodiment, the second nonmagnetic metallic spacer layer 190 can include an electrically conductive metallic material. The thickness of the second nonmagnetic metallic spacer layer 190 can be in a range from 0.2 nm to 2 nm, although lesser and greater thicknesses can also be employed. The second nonmagnetic metallic spacer layer 190 can include the same material as, or can include a material different from, the material of the first nonmagnetic metallic spacer layer 150.

The pinned magnetization layer 192 is a magnetic layer which has a positive uniaxial magnetic anisotropy. In other words, the value of $K_1$ is positive and the term $K_1 \sin^2 \theta$ dominates all other higher order terms and terms depending on $\sin(n\phi)$ (or $\cos(n\phi)$) in the magnetic anisotropy energy per volume for the material of the pinned magnetization layer 192. The positive uniaxial magnetic anisotropy of the pinned magnetization layer 192 provides a magnetization that is parallel or antiparallel to the fixed vertical magnetization of the reference layer 132. In one embodiment, the value of $K_1$ for the pinned magnetization layer 192 can be greater than the value of $K_1$ for the free layer 136 such that the magnetization of the pinned magnetization layer 192 stays pinned along the vertical direction, i.e., perpendicular to the interfaces among the various layers of the discrete patterned layer stack (120, 140, 150, 162, 164, 166, 190, 192, 170), during programming of the MRAM cell 180. The magnetization of the pinned magnetization layer 192 may remain parallel to, or antiparallel to, the magnetization of the reference layer 132.

In one embodiment, the pinned magnetization layer 192 can include either a Co/Ni or Co/Pt multilayer structure. The pinned magnetization layer 192 can additionally include a thin non-magnetic layer comprised of tantalum having a thickness of 0.2 nm~0.5 nm and a thin CoFeB layer (having a thickness in a range from 0.5 nm to 2 nm). The pinned magnetization layer 192 can cause the in-plane magnetization of the second magnetic assist layer 166 to oscillate. The out-of-plane oscillation of the magnetization of the second magnetic assist layer 166 can produce a rotating spin torque on the magnetization of the free layer 136 during programming, and thus, can help the switching of the magnetization of the free layer 136 with lesser electrical current through the discrete patterned layer stack (120, 140, 150, 162, 164, 166, 190, 192, 170). In one embodiment, the combination of the magnetization of the pinned magnetization layer 192, the first magnetic assist layer 162, and second magnetic assist layer 166 applies a non-horizontal non-vertical magnetic field (i.e., a field which is neither parallel to not perpendicular to the fixed magnetization direction of the reference layer 132) on the magnetization of the free layer 136 to reduce the magnitude of the required electrical current through the discrete patterned layer stack (120, 140, 150, 162, 164, 166, 190, 192, 170) during switching of the magnetization of the free layer 136.

Figure 3D:
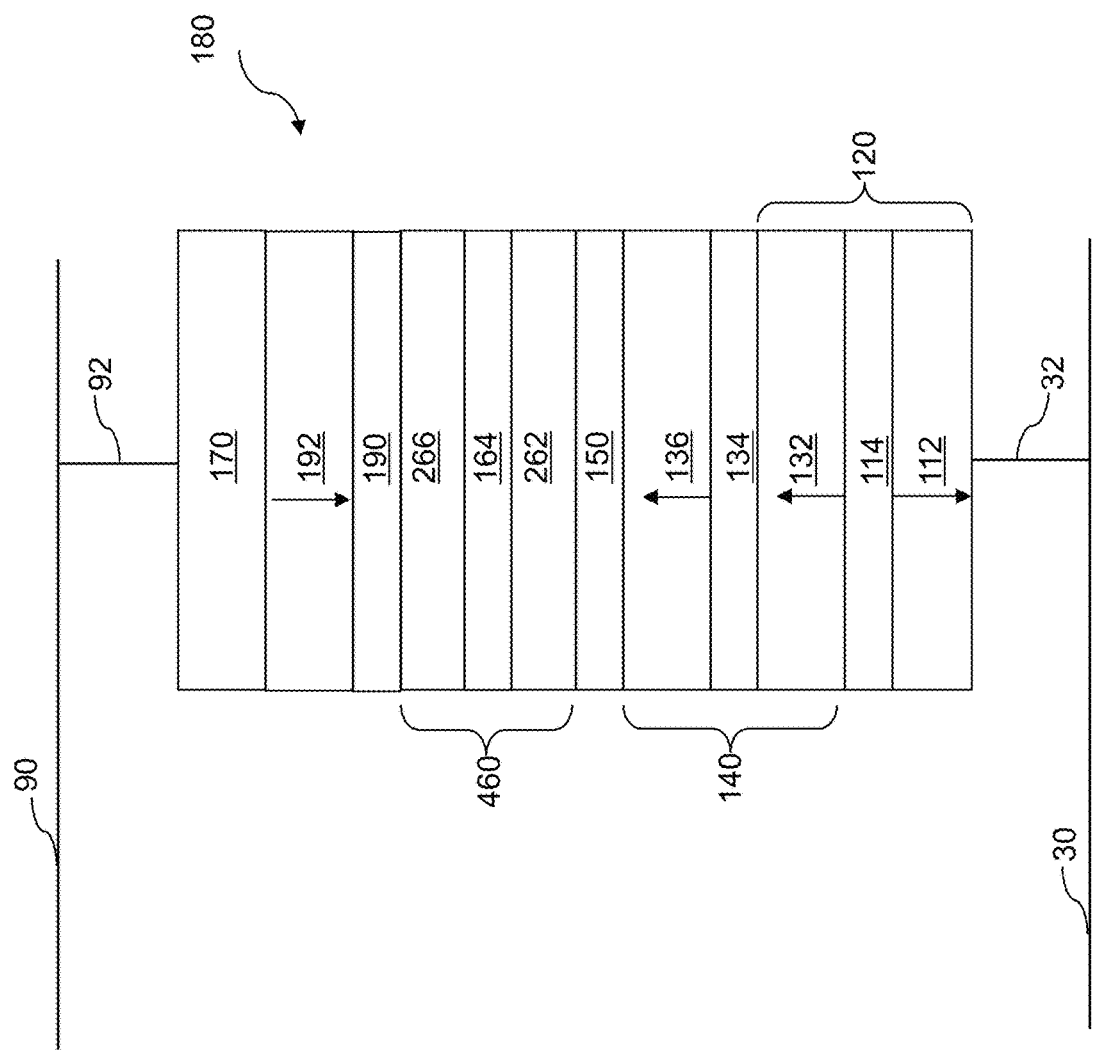
FIG. 3D illustrates a fourth configuration of the second exemplary STT MRAM cell according to the second embodiment of the present disclosure.

Referring to FIG. 3D, a fourth configuration of the second exemplary spin-transfer torque MRAM cell 180 can be derived from the third configuration of the second exemplary spin-transfer torque magnetic memory device illustrated in FIG. 3C by replacing the first magnetic assist layer 162 having the first in-plane magnetization with a first magnetic assist layer 262 including a first ferromagnetic material having no uniaxial magnetic anisotropy, and by replacing the second magnetic assist layer 166 having the second in-plane magnetization with a second magnetic assist layer 266 including a second ferromagnetic material having no uniaxial magnetic anisotropy.

The thickness of the antiferromagnetic coupling spacer layer 164 is selected to provide an antiferromagnetic coupling between the first magnetization of the first magnetic assist layer 262 and the second magnetization with a second magnetic assist layer 266. Thus, the first magnetization of the first magnetic assist layer 262 and the second magnetization of the second magnetic assist layer 266 can be antiferromagnetically coupled. Further, the variations in the magnetic anisotropy energy per volume as a function of spatial orientations of the first and second magnetizations (which remain antiparallel to each other) can be on par with, or less than, the thermal energy at room temperature, i.e., $k_B T$ in which T is 297.15 Kelvin.

The second exemplary spin-transfer torque MRAM cell 180 can be programmed and read individually. Reading, i.e., sensing, the magnetization state of the free layer 136 can be performed by applying a read bias voltage across the first terminal 92 and the second terminal 32 of a selected discrete patterned layer stack {120, 140, 150, (162 or 262), 164, (166 or 266), 170} or {120, 140, 150, (162 or 262), 164, (166 or 266), (190, 192), 170}. The parallel or antiparallel alignment between the magnetization of the free layer 136 and the reference layer 132 determines the electrical resistance of the selected discrete patterned layer stack in each MRAM cell 180, and thus, determines the magnitude of the electrical current that flows between the first terminal 92 and the second terminal 32. The magnitude of the electrical current can be sensed to determine the magnetization state of the free layer 136 and the data encoded by the detected magnetization state.

Figure 4A:
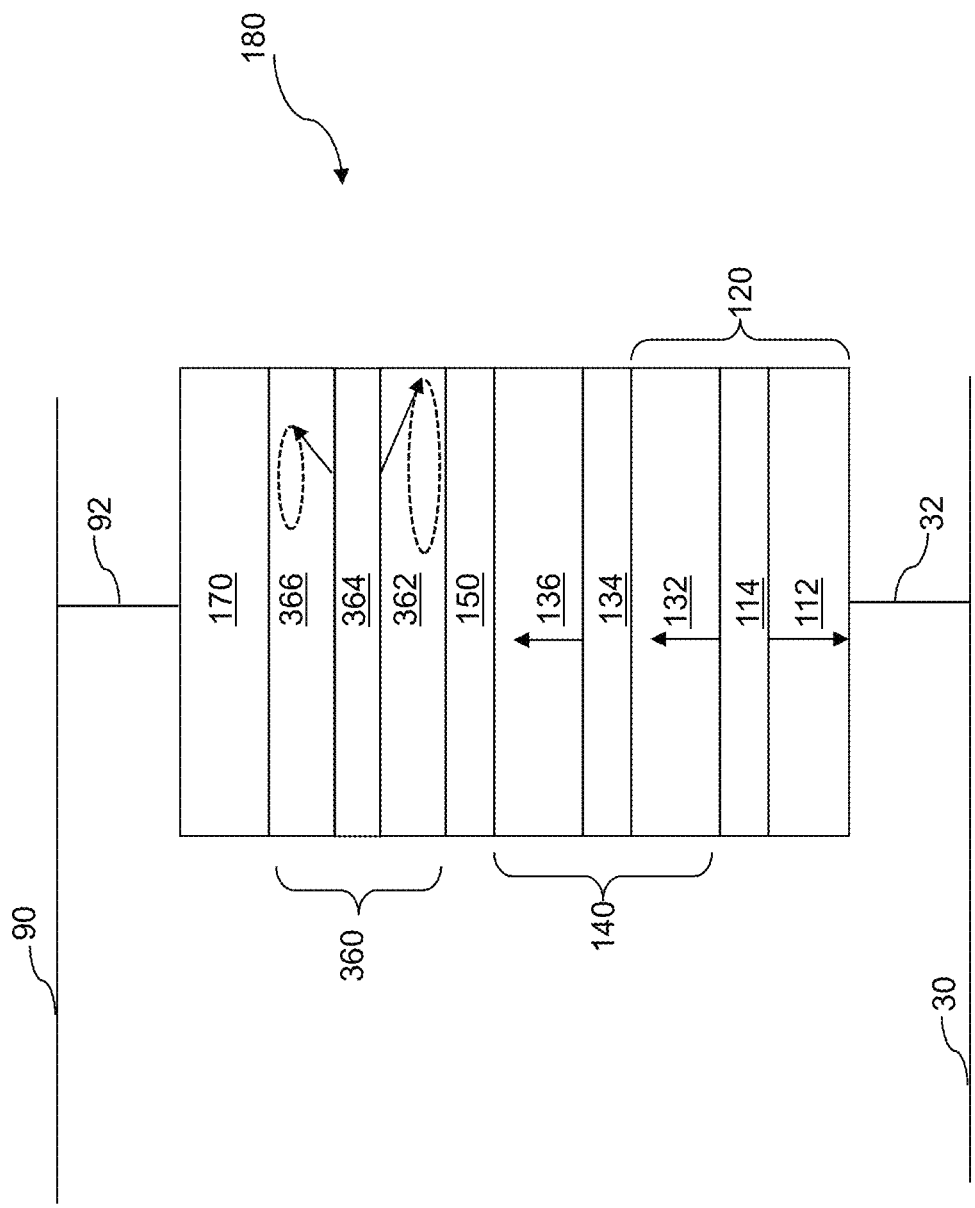
FIG. 4A illustrates a first configuration of a third exemplary STT MRAM cell according to a third embodiment of the present disclosure.

Referring to FIG. 4A, a first configuration of a third exemplary STT MRAM cell 180 according to a third embodiment is schematically illustrated. The first configuration of the second exemplary MRAM cell 180 can be derived from the first configuration of the first exemplary MRAM cell 180 of FIG. 2A by replacing the first magnetic assist layer 160 with a magnetic assist layer stack (e.g., a spin torque oscillator stack) 360.

The magnetic assist layer stack 360 includes a first magnetic assist layer (e.g., spin torque layer) 362, a non-magnetic spacer layer 364, and a second magnetic assist layer (e.g., spin polarization layer) 366 from one side to another.

The spin torque layer 362 includes a first magnetic material having a first conical magnetization (e.g., magnetization direction) with respect to a vertical direction that is parallel to the fixed vertical magnetization (e.g., magnetization direction) of the reference layer 132. As used herein, a "conical magnetization" refers to a rotating magnetization (e.g., magnetization direction) having an angle greater than zero but less than 90 degrees, such as 10 to 80 degrees, for example 30 to 60 degrees with respect to an axis parallel to the fixed vertical magnetization (e.g., magnetization direction) of the reference layer 132.

A conical magnetization can be provided for various symmetry types for the magnetic anisotropy energy per volume. For example, a ferromagnetic film having magnetic anisotropy energy per volume having an axis of sixfold rotational symmetry about a vertical axis perpendicular to the plane of the ferromagnetic film can have a functional dependence on the tilt angle θ from the vertical axis and the azimuthal angle ϕ in the form of: $E/V = K_1 \sin^2 \theta + K_2 \sin^4 \theta + K_3 \sin^6 \theta \cos(6\phi))$. If $K_1$ is negative and $K_2$ is greater than $K_1/2$, the ferromagnetic film has a bidirectional cone of easy magnetization direction at two values of q. The cone angles $\theta_{c1}$ and $\theta_{c2}$ for the bidirectional cone of easy magnetization direction are related by $\theta_{c2} = \pi - \theta_{c1}$.

Ferromagnetic films having different magnetic anisotropy symmetry can provide a conical magnetization is a similar manner. For example, a ferromagnetic film having magnetic anisotropy energy per volume having a tetrahedral symmetry can have a functional dependence on the tilt angle θ from the vertical axis and the azimuthal angle ϕ in the form of: $E/V = K_1 \sin^2 \theta + K_2 \sin^4 \theta + K_3 \sin^4 \theta \sin(2\phi)$. A ferromagnetic film having magnetic anisotropy energy per volume having a rhombohedral symmetry can have a functional dependence on the tilt angle θ from the vertical axis and the azimuthal angle ϕ in the form of: $E/V = K_1 \sin^2 \theta + K_2 \sin^4 \theta + K_3 \cos \theta \sin^3 \cos(3\phi)$. If the value of $K_3$ is zero or insignificant compared to ½ $k_B T$ in which $k_B$ is the Boltzmann constant and T is room temperature in Kelvin, i.e., 297.15 in the magnetic anisotropy energy per volume, the conical magnetization is free to rotate (e.g., oscillate with a high frequency) around the vertical axis.

In one embodiment, the azimuthally-dependent component of the magnetic anisotropy of the spin torque layer 362 may be zero or insignificant compared to the thermal energy at room temperature, i.e., $k_B T$ in which $k_B$ is the Boltzmann constant and T is 297.15 Kelvin (which is the room temperature). For example, the maximum variation of the magnetic anisotropy energy per unit volume around a vertical axis that is parallel to the fixed vertical magnetization of the reference layer 132 can be less than ½ times the thermal energy at room temperature. In such cases, the conical magnetization of the spin torque layer 362 is free to precess within the horizontal plane that is parallel to the interface between the first nonmagnetic metallic spacer layer 150 and the spin torque layer 362 upon application of electrical current through the spin torque layer 362. In one embodiment, the magnetic energy of the spin torque layer 362 may be invariant under rotation of the magnetization of the spin torque layer 362 within the horizontal plane.

The spin torque layer 362 can include any ferromagnetic film that provides a conical magnetization. For example, the spin torque layer 362 can include a conical magnetization material such as rare-earth elements such as neodymium, erbium, or alloys of at least one rare-earth magnetic element and non-rare-earth element such as iron, boron, cobalt, copper, and/or zirconium. In one embodiment, the spin torque layer 362 can include a homogeneous conical magnetization material, i.e., a homogeneous material that provides a conical magnetization. As used herein, a "homogeneous" material refers to a material having a uniform material composition throughout. The thickness of the spin torque layer 362 can be in a range from 0.6 nm to 10 nm, such as from 1.2 nm to 5 nm, although lesser and greater thicknesses can also be employed.

The nonmagnetic spacer layer 364 can be located on the spin torque layer 362 on the opposite side of the first nonmagnetic metallic spacer layer 150. In one embodiment, the nonmagnetic spacer layer 364 comprises a metallic material that induces Ruderman-Kittel-Kasuya-Yosida (RKKY) coupling interaction between the first magnetic assist layer (e.g., spin torque layer) 362 and a second magnetic assist layer (e.g., spin polarization layer) 366 that is located on the opposite side of the nonmagnetic spacer layer 364 from the first magnetic assist layer 362. In one embodiment, the nonmagnetic spacer layer 364 comprises, and/or consists essentially of, ruthenium, and can have a thickness within a range from 0.1 nm to 1.0 nm.

In one embodiment, the second magnetic assist layer (e.g., the spin polarization layer) 366 can be provided on the nonmagnetic spacer layer 364. In another embodiment, the order of formation of the spin torque layer 362 and the spin polarization layer 366 can be reversed, such that the spin polarization layer 366 is located closer to the free layer 136 than the spin torque layer 362. In general, a spin torque oscillator stack (e.g., an assist layer stack) 360 includes the nonmagnetic spacer layer 364 located between the spin torque layer 362 and the spin polarization layer 366.

The spin polarization layer 366 has a conical magnetization, which is herein referred to as a second conical magnetization. The spin polarization layer 366 can include a single magnetic material layer or a plurality of magnetic material layers. The second conical magnetization of the spin polarization layer 366 can be provided by the single magnetic material layer having the second conical magnetization, or can be provided by a set of ferromagnetic material layers having an in-plane magnetization and a perpendicular (i.e., vertical or axial) magnetization. The second magnetic material has an in-plane magnetization component that is perpendicular to the fixed vertical magnetization (e.g., magnetization direction) of the reference layer 132. The in-plane magnetization component of the second magnetic material is antiferromagnetically coupled to the in-plane component of the first conical magnetization.

FIG. 4A illustrates an embodiment in which the spin polarization layer 366 consists of a single ferromagnetic material layer having the second conical magnetization with respect to a vertical direction that is parallel to the fixed vertical magnetization of the reference layer 132. In one embodiment, the azimuthally-dependent component of the magnetic anisotropy of the spin polarization layer 366 may be zero or insignificant compared to the thermal energy at room temperature, i.e., $k_BT$ in which $k_B$ is the Boltzmann constant and T is 297.15 Kelvin (which is the room temperature). For example, the maximum variation of the magnetic anisotropy energy per unit volume around a vertical axis that is parallel to the fixed vertical magnetization of the reference layer 132 can be less than ½ times the thermal energy at room temperature. In such cases, the conical magnetization of the spin polarization layer 366 is free to precess within the horizontal plane that is parallel to the interface between the first nonmagnetic spacer layer 150 and the spin torque layer 362 upon application of electrical current through the spin polarization layer 366. In one embodiment, the magnetic energy of the spin polarization layer 366 may be invariant under rotation of the magnetization of the spin polarization layer 366 within the horizontal plane.

In one embodiment, the spin polarization layer 366 can include any ferromagnetic film that provides a conical magnetization. For example, the spin polarization layer 366 can include a conical magnetization material such as rare-earth elements such as neodymium, erbium, or alloys of at least one rare-earth magnetic element and non-rare-earth element such as iron, boron, cobalt, copper, and/or zirconium. In one embodiment, the spin polarization layer 366 can include a homogeneous conical magnetization material, i.e., a homogeneous material that provides a conical magnetization. The ferromagnetic materials of the spin torque layer 362 and the spin polarization layer 366 may be the same or different. The thickness of the spin polarization layer 366 can be in a range from 0.6 nm to 10 nm, such as from 1.2 nm to 5 nm, although lesser and greater thicknesses can also be employed.

In case the magnetization of the spin polarization layer 366 is a conical magnetization, i.e., a second conical magnetization, the second conical magnetization of the spin polarization layer 366 can couple with the first conical magnetization of the spin torque layer 362 in various modes.

As shown in FIG. 4A, the spin polarization layer 366 can be provided as a single spin polarization layer having a homogeneous composition and can have the second conical magnetization with respective to the vertical direction. Generally, the single spin polarization layer can have an axial magnetization component that is parallel or antiparallel to an axial magnetization component of the first conical magnetization of the spin torque layer 362. In some embodiments, the spin polarization layer 366 can have an axial magnetization component (i.e., a vertical magnetization component) that is antiparallel to an axial component of the conical magnetization of the spin torque layer 362. In some embodiments, the spin polarization layer 366 can have an axial magnetization component (i.e., a vertical magnetization component) that is parallel to an axial component of the conical magnetization of the spin torque layer 362.

In one embodiment, a nonmagnetic metallic capping layer 170 can be located over the spin polarization layer 366. The nonmagnetic metallic capping layer 170 can include a nonmagnetic, electrically conductive material such as W, Ti, Ta, WN, TiN, TaN, Ru, and Cu. The thickness of the nonmagnetic metallic capping layer 170 can be in a range from 1 nm to 20 nm, although lesser and greater thicknesses can also be employed.

The layer stack including the material layers from the SAF structure 120 to the nonmagnetic metallic capping layer 170 can be deposited upward or downward, i.e., from the SAF structure 120 toward the nonmagnetic metallic capping layer 170 or from the nonmagnetic metallic capping layer 170 toward the SAF structure 120. The layer stack can be formed as a stack of continuous layers, and can be subsequently patterned into discrete patterned layer stacks for each MRAM cell 180.

As in the first embodiment illustrated in FIG. 2A, the MRAM cell 180 can include a first terminal 92 that is electrically connected to or comprises a portion of a bit line 90 (shown in FIG. 1) and second terminal 32 that is electrically connected to or comprises a portion of a word line 30 (shown in FIG. 1). The location of the first and second terminals may be switched such that the first terminal is electrically connected to the SAF structure 120 and the second terminal is electrically connected to the nonmagnetic metallic capping layer 170.

Optionally, each MRAM cell 180 can include a dedicated steering device, such an access transistor or diode configured to activate a respective discrete patterned layer stack (120, 140, 150, 360, 170) upon application of a suitable voltage to the steering device. The steering device may be electrically connected between the patterned layer stack and one of the respective word lines 30 or bit lines 90 of the respective MRAM cell 180.

In one embodiment, the polarity of the voltage applied to the first terminal 92 can be changed depending on the polarity of the magnetization state to be programmed in the free layer 136. For example, a voltage of a first polarity can be applied to the first terminal 92 (with respect to the second terminal 32) during a transition from an antiparallel state to a parallel state, and a voltage of a second polarity (which is the opposite of the first polarity) can be applied to the first terminal 92 during a transition from a parallel state to an antiparallel state. Further, variations in the circuitry for activating the discrete patterned layer stack (120, 140, 150, 360 170) are also contemplated herein.

The magnetization direction of the free layer 136 can be flipped (i.e., from upward to downward or vice versa) by flowing electrical current through the discrete patterned layer stack (120, 140, 150, 362, 364, 366, 170). The magnetization direction of the free layer 136 can precess around the vertical direction (i.e., the direction of the flow of the electrical current) during the programming process until the direction of the magnetization flips by 180 degrees, at which point the flow of the electrical current stops.

The first conical magnetization of the spin torque layer 362 and the second conical magnetization of the spin polarization layer 366 are free to precess around a vertical axis that is parallel to the fixed vertical magnetization of the reference layer 132 upon application of electrical current through the spin torque layer 362, the nonmagnetic spacer layer 364, and the spin polarization layer 366, e.g., during programming. The fixed vertical magnetization of the reference layer 132 maintains the same orientation upon application of electrical current through the reference layer 132. The first and second conical magnetizations can have the same or different cone angles.

During operation of the MRAM cell, electrical current can be flowed through the spin valve 140, the first nonmagnetic metallic spacer layer 150, the spin torque layer 362, the nonmagnetic spacer layer 364, and the spin polarization layer 366. The spin torque oscillator stack 360 comprising the combination of the spin torque layer 362, the nonmagnetic spacer layer 364, and the spin polarization layer 366 is configured to provide an initial non-zero torque to a magnetization of the free layer 136 during an initial phase of precession of the magnetization of the free layer 136 around a vertical axis that is parallel to the fixed vertical magnetization of the reference layer 132 upon initiation of flow of electrical current through the MRAM cell 180. The MRAM cell 180 is configured to provide magnetic coupling between the magnetization of the free layer 136 and the first magnetization of the spin torque layer 362 during precession of the magnetization of the free layer 136 around a vertical axis that is parallel to the fixed vertical magnetization of the reference layer 132, and to provide synchronized precession of the first magnetization of the spin torque layer 362 and the magnetization of the free layer 136 while electrical current flows through the MRAM cell 180.

Figure 4B:
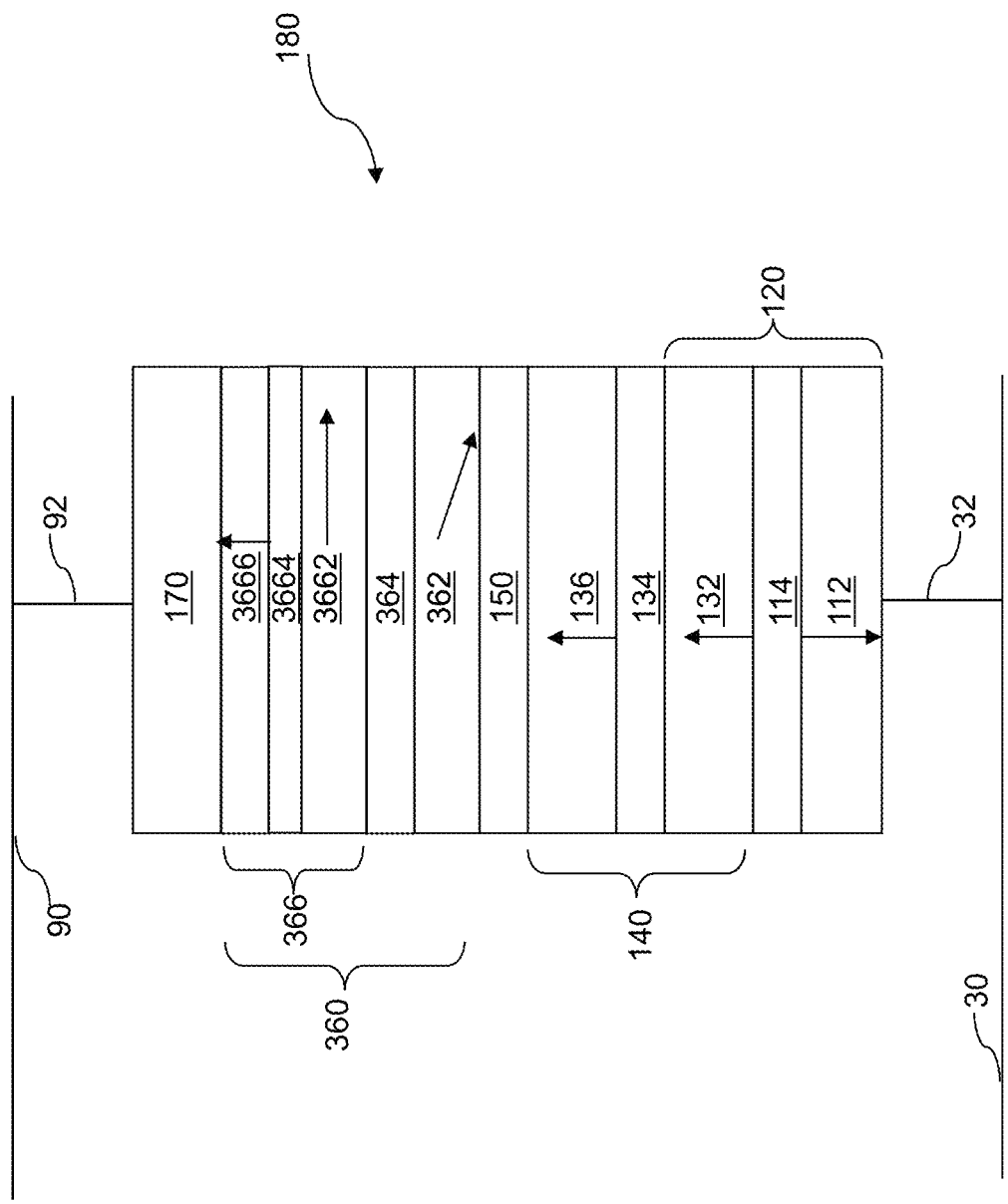
FIG. 4B illustrates a second configuration of the third exemplary STT MRAM cell according to a third embodiment of the present disclosure.

Referring to FIG. 4B, a second configuration of the third exemplary spin-transfer torque MRAM cell 180 is illustrated. The spin polarization layer 366 includes a layer stack of multiple layers (3662, 3664, 3666) having different material compositions. The spin polarization layer 366 includes a layer stack of a first spin polarization component layer 3662 having a magnetization that is the same as the in-plane magnetization component of the second conical magnetization. The first spin polarization component layer 3662 can have a zero magnetic anisotropy or negative uniaxial magnetic anisotropy so that the magnetization of the first spin polarization component layer 3662 is parallel to the interfaces among the various layers of the nonmagnetic spacer layer 364.

In one embodiment, the first spin polarization component layer 3662 comprises, and/or consists essentially of, a cobalt-iridium alloy. The material composition of the cobalt-iridium alloy can be selected to provide negative uniaxial magnetic anisotropy. In one embodiment, the cobalt-iridium alloy can include cobalt atoms at an atomic concentration in a range from 60% to 98%, such as from 70% to 90%, and iridium atoms at the atomic concentration of the balance. In an illustrative example, a cobalt-iridium alloy having a composition of $Co_{0.8}Ir_{0.2}$ has a $K_1$ value of about $-0.6\times106$ J/m$^3$. In another embodiment, the first spin polarization component layer 3662 comprises, and/or consists essentially of, a cobalt-iron alloy. The material composition of the cobalt-iron alloy can be selected to provide negative uniaxial magnetic anisotropy. In one embodiment, the cobalt-iron alloy can include cobalt atoms at an atomic concentration in a range from 80% to 99.8%, such as from 90% to 99.5%, and iron atoms at the atomic concentration of the balance. In an illustrative example, a cobalt-iron alloy having a composition of $Co_{0.99}Ir_{0.1}$ has a $K_1$ value of about $-0.99\times106$ J/m$^3$. In another embodiment, the first spin polarization component layer 3662 comprises, and/or consists essentially of, a cobalt-iron-boron (CoFeB) alloy. The thickness of the first spin polarization component layer 3662 can be in a range from 1 nm to 10 nm, such as from 1.5 nm to 6 nm, although lesser and greater thicknesses can also be employed.

In another embodiment, the first spin polarization component layer 3662 includes a multilayer stack containing multiple repetitions of a first magnetic material layer and a second magnetic material layer. The first magnetic material layer can include, and/or can consist essentially of, a first magnetic material. The second magnetic material layer can include, and/or can consist essentially of, a second magnetic material.

In one embodiment, the first magnetic material layers comprise cobalt, and the second magnetic material layers comprise iron. In one embodiment, the first magnetic material layers consist essentially of cobalt, and the second magnetic material layers consist essentially of iron. The thickness of each first magnetic material layer can be in a range from 0.3 nm to 1 nm, and the thickness of each second magnetic material layer can be in a range from 0.3 nm to 1 nm. The total number of repetitions (i.e., the total number of pairs of a first magnetic material layer and a second magnetic material layer) within the first spin polarization component layer 3662 can be in a range from 2 to 20, such as from 4 to 10. In one embodiment, the multilayer stack comprises a periodic repetition of a unit layer stack that includes a first magnetic material layer and a second magnetic material layer. In an illustrative example, an interlaced cobalt-iron multilayer stack including repetitions of a unit layer stack consisting of a cobalt layer and an iron layer having the same thickness can have a K1 value of about $-1.1\times10^6$ J/m$^3$.

The spin polarization layer 366 further includes a second spin polarization component layer 3666 having an axial magnetization that is parallel or antiparallel to the vertical direction of the reference layer 132. In one embodiment, the second spin polarization component layer 3666 includes a multilayer stack of cobalt layers and either platinum or palladium layers. The second spin polarization component layer 3666 can have a positive uniaxial magnetic anisotropy so that the magnetization of the second spin polarization component layer 3666 is axial, i.e., perpendicular to the interfaces among the various layers of the MRAM cell 180. The axial magnetization of the second spin polarization component layer 3666 can be parallel or antiparallel to the fixed vertical direction of magnetization of the reference layer 132.

In one embodiment, the second spin polarization component layer 3666 can be vertically spaced from the first spin polarization component layer 3662 by an optional nonmagnetic spacer layer 3664. The nonmagnetic spacer layer 3664 can include a nonmagnetic metallic materials such as Cu, Ag, AgSn, Cr, Ru, Ta, TaN, or CuN. In one embodiment, the first spin polarization component layer 3662 can be in contact with the nonmagnetic spacer layer 364.

In this case, the combined magnetization of the first spin polarization component layer 3662 and the second spin polarization component layer 3666 provides the second conical magnetization, which is free to rotate (e.g., oscillate) around the vertical axis during programming of the MRAM cell 180. In this case, the combined magnetization of the first spin polarization component layer 3662 and the second spin polarization component layer 3666 provides an additional conical magnetization (i.e., the second conical magnetization) that is coupled to the first conical magnetization of the spin torque layer 362. During programming, the second conical magnetization and the first conical magnetization precess around a vertical axis that is parallel to the vertical direction of the magnetization of the reference layer 132 upon application of electrical current through the spin torque layer 362, the nonmagnetic spacer layer 364, and the spin polarization layer 366. The first and second conical magnetizations can have the same or different cone angles.

Figure 4C:
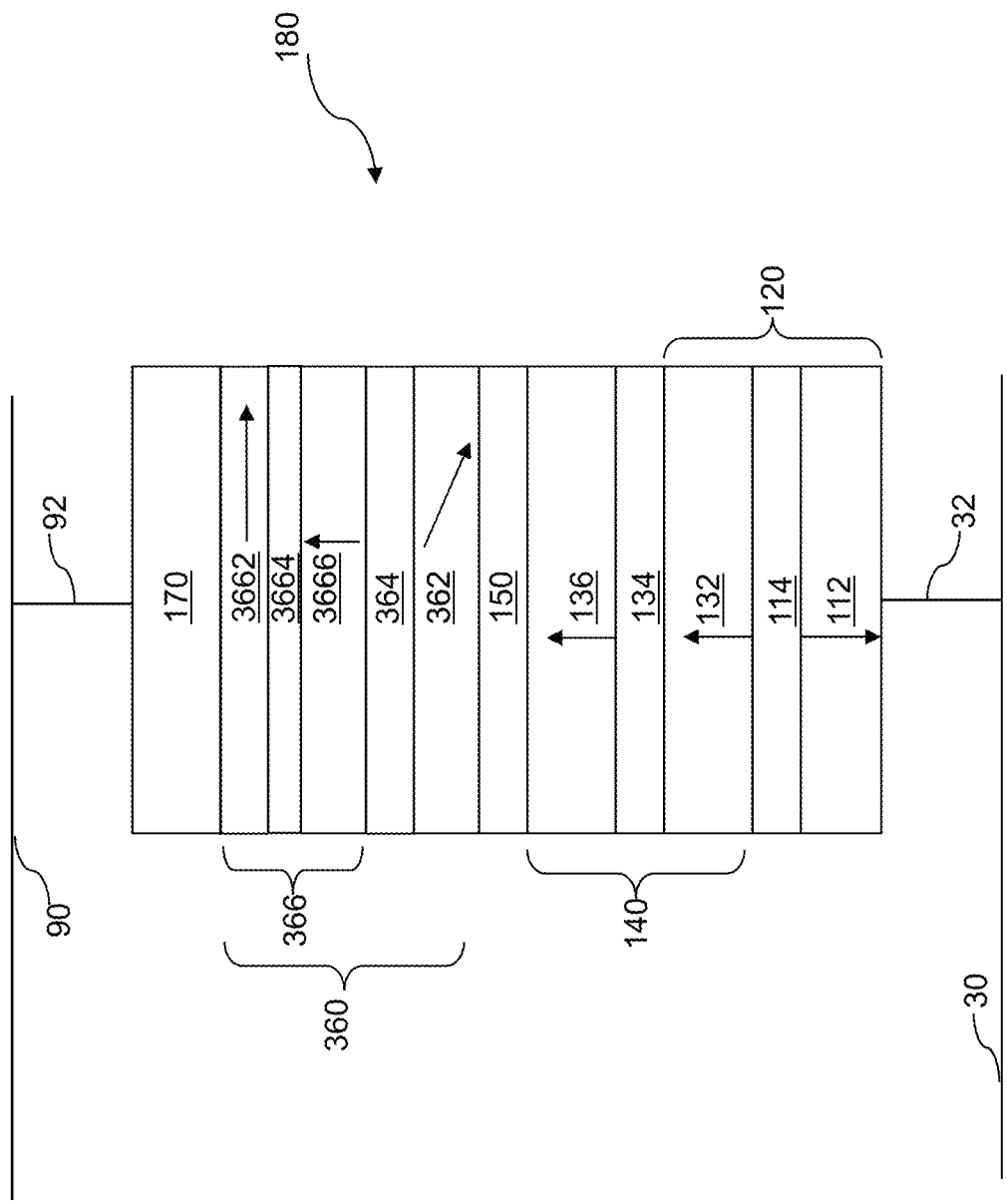
FIG. 4C illustrates a third configuration of the third exemplary STT MRAM cell according to the third embodiment of the present disclosure.

Referring to FIG. 4C, a third configuration of the exemplary spin-transfer torque MRAM cell 180 according to an embodiment of the present disclosure can be derived from the second configuration of the exemplary spin-transfer torque MRAM cell 180 by exchanging the positions of the first spin polarization component layer 3662 and the second spin polarization component layer 3666. In this case, the second spin polarization component layer 3666 can be in contact with the nonmagnetic spacer layer 364. The exemplary spin-transfer torque MRAM cell 180 in the third configuration can operate in the same manner as the exemplary spin-transfer torque MRAM cells 180 in the first and second configurations.

Figure 4D:
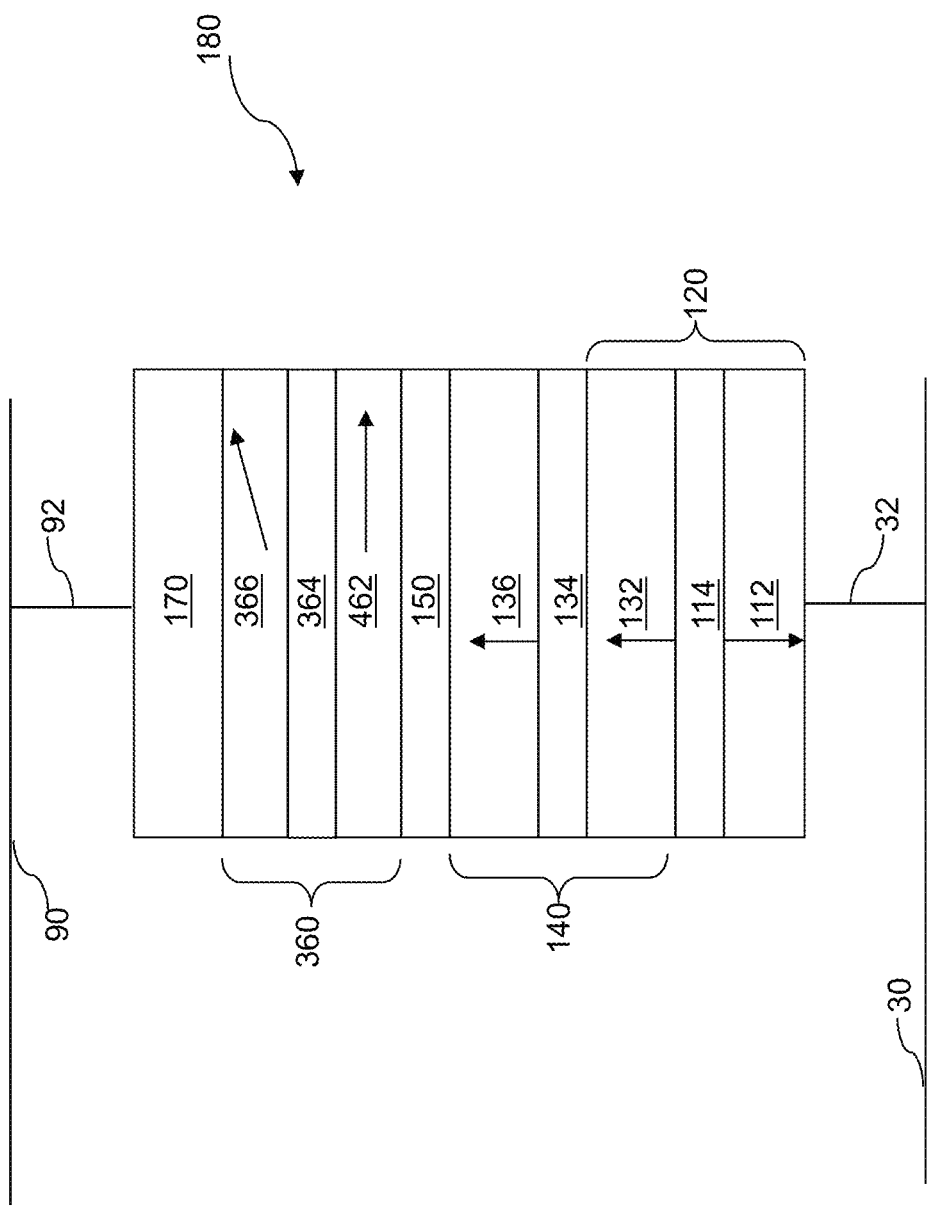
FIG. 4D illustrates a fourth configuration of the third exemplary STT MRAM cell according to the third embodiment of the present disclosure.

FIG. 4D illustrates a fourth configuration of an exemplary spin-transfer torque MRAM cell 180 according to an embodiment of the present disclosure. The fourth configuration of the exemplary spin-transfer torque MRAM cell 180 can be derived from the first, second, and third configuration of the exemplary spin-transfer torque MRAM cell 180 by substituting a spin torque layer 462 having an in-plane magnetization (i.e., having negative uniaxial magnetic anisotropy) in place of the spin torque layer 362 having a first conical magnetization. In other words, the axial component of the magnetization of the spin torque layer 462 can be zero, and the magnetization (e.g., magnetization direction) of the spin torque layer 462 can consist of an in-plane component (i.e., zero cone angle). In this case, the total magnetization of the spin torque layer 462 is the same as the in-plane magnetization component of the spin torque layer 462. In this configuration, the cone angles of the first and second magnetizations are different.

In one embodiment, the spin torque layer 462 comprises a homogeneous negative uniaxial magnetic anisotropy material. As used herein, a "homogeneous" material refers to a material having a uniform material composition throughout. In one embodiment, the spin torque layer 462 comprises, and/or consists essentially of, a cobalt-iridium alloy. The material composition of the cobalt-iridium alloy can be selected to provide negative uniaxial magnetic anisotropy. In one embodiment, the cobalt-iridium alloy can include cobalt atoms at an atomic concentration in a range from 60% to 98%, such as from 70% to 90%, and iridium atoms at the atomic concentration of the balance. In an illustrative example, a cobalt-iridium alloy having a composition of $Co_{0.8}Ir_{0.2}$ has a $K_1$ value of about $-0.6\times106$ J/m$^3$. In another embodiment, the spin torque layer 462 comprises, and/or consists essentially of, a cobalt-iron alloy. The material composition of the cobalt-iron alloy can be selected to provide negative uniaxial magnetic anisotropy. In one embodiment, the cobalt-iron alloy can include cobalt atoms at an atomic concentration in a range from 80% to 99.8%, such as from 90% to 99.5%, and iron atoms at the atomic concentration of the balance. In an illustrative example, a cobalt-iron alloy having a composition of $Co_{0.99}Ir_{0.1}$ has a $K_1$ value of about $-0.99\times106$ J/m$^3$. In another embodiment, the spin torque layer 462 comprises, and/or consists essentially of, a cobalt-iron-boron (CoFeB) alloy. The thickness of the spin torque layer 462 can be in a range from 1 nm to 10 nm, such as from 1.5 nm to 6 nm, although lesser and greater thicknesses can also be employed.

In another embodiment, the spin toque layer 462 includes a multiplayer stack containing multiple repetitions of a first magnetic material layer and a second magnetic material layer. The first magnetic material layer can include, and/or can consist essentially of, a first magnetic material. The second magnetic material layer can include, and/or can consist essentially of, a second magnetic material.

In one embodiment, the first magnetic material layers comprise cobalt, and the second magnetic material layers comprise iron. In one embodiment, the first magnetic material layers consist essentially of cobalt, and the second magnetic material layers consist essentially of iron. The thickness of each first magnetic material layer can be in a range from 0.3 nm to 1 nm, and the thickness of each second magnetic material layer can be in a range from 0.3 nm to 1 nm. The total number of repetitions (i.e., the total number of pairs of a first magnetic material layer and a second magnetic material layer) within the spin torque layer 462 can be in a range from 2 to 20, such as from 4 to 10. In one embodiment, the multilayer stack comprises a periodic repetition of a unit layer stack that includes a first magnetic material layer and a second magnetic material layer. In an illustrative example, an interlaced cobalt-iron multilayer stack including repetitions of a unit layer stack consisting of a cobalt layer and an iron layer having the same thickness can have a K1 value of about $-1.1\times10^6$ J/m$^3$. The spin torque layer 462 may be used with any of the spin polarization layers 366 described above with respect to the first through third embodiments.

Figure 5A:
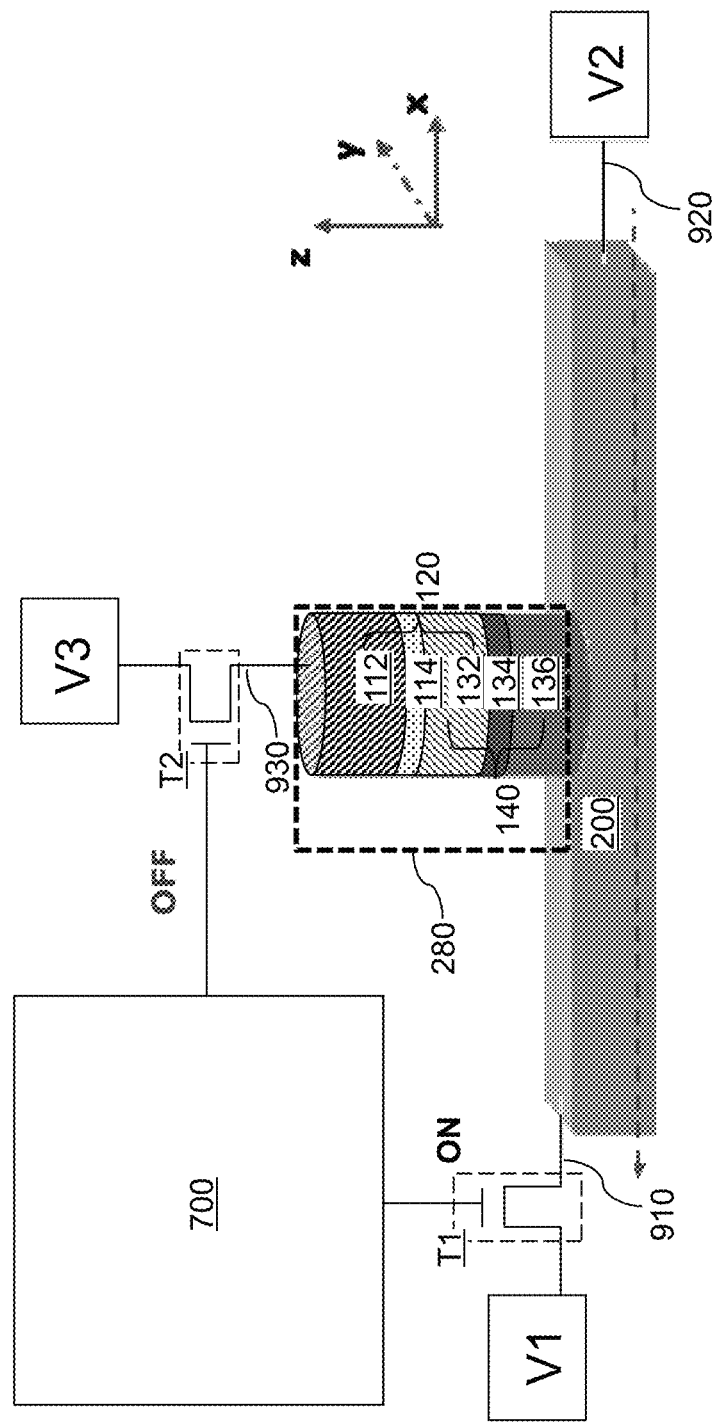
FIG. 5A illustrates a first step of a programming operation for an exemplary SOT MRAM cell according to a fourth embodiment of the present disclosure.
Figure 5B:
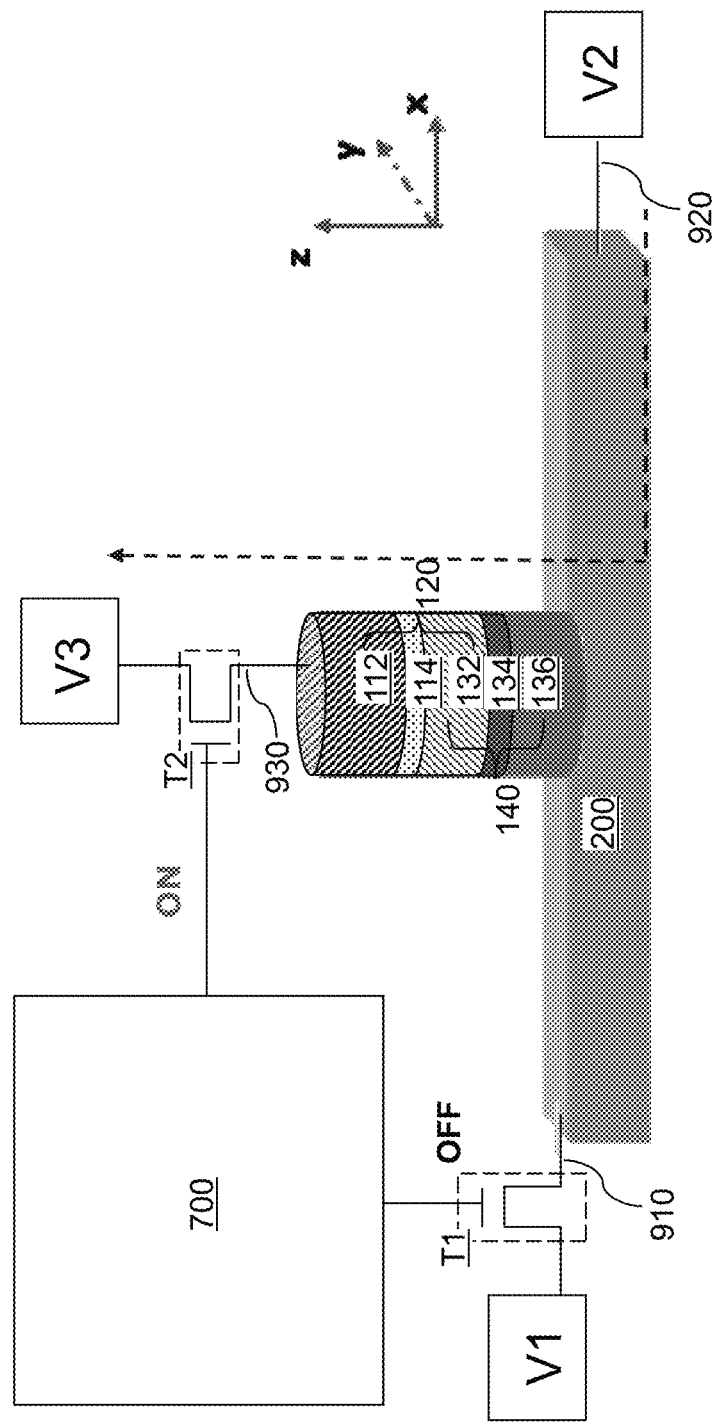
FIG. 5B illustrates a second step of a programming operation for the exemplary SOT MRAM cell according to the fourth embodiment of the present disclosure.
Figure 5C:
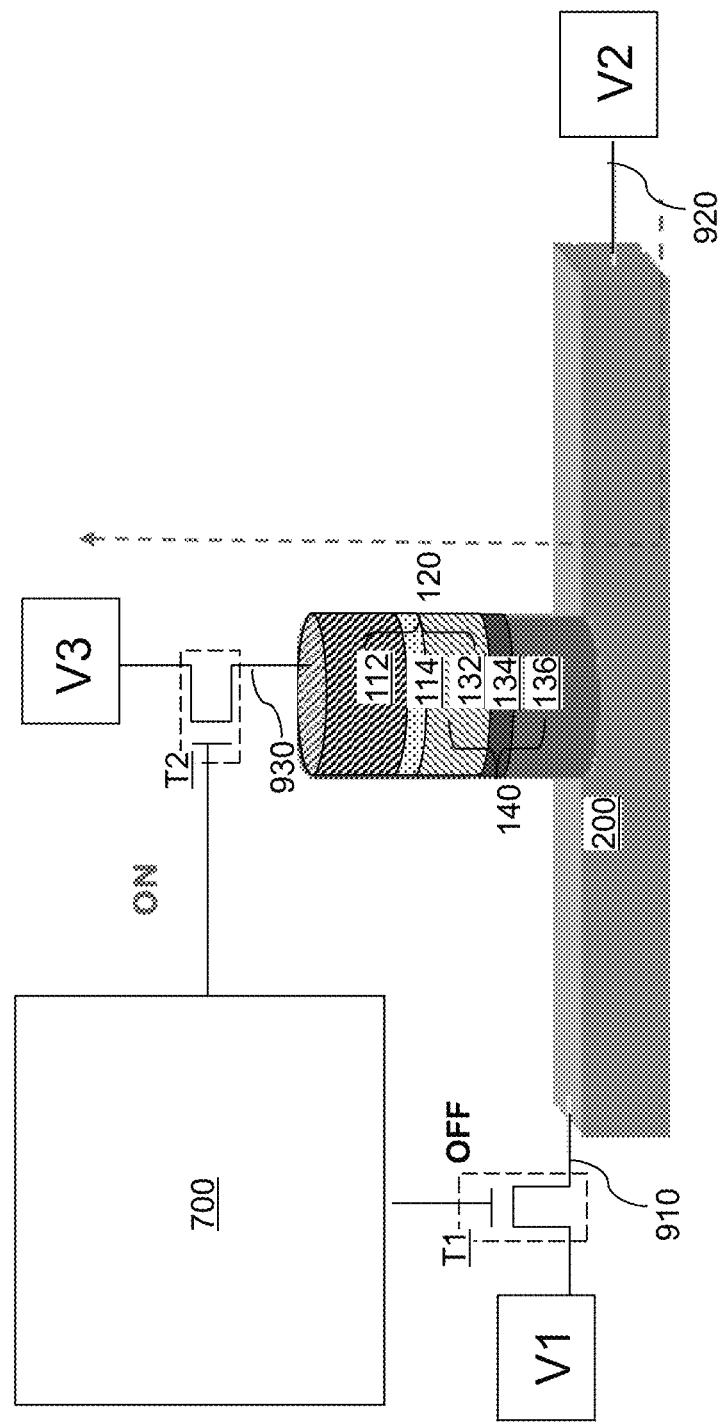
FIG. 5C illustrates a read operation for the exemplary SOT MRAM cell according to the fourth embodiment of the present disclosure.

Referring to FIGS. 5A-5C, an exemplary spin orbit torque (SOT) magnetic memory device according to a fourth embodiment of the present disclosure is illustrated. In one embodiment, the SOT magnetic memory device of FIGS. 5A-5C can include a SOT MRAM memory cell 280 which includes only metallic materials for operation at cryogenic temperatures, e.g., in quantum computing environment. In one embodiment, the SOT magnetic memory device of FIGS. 5A-5C uses a two-step programming operation. FIG. 5A illustrates the SOT magnetic memory device during a first step of the two-step programming operation, and FIG. 5B illustrates the SOT magnetic memory device during a second step of the two-step programming operation. FIG. 5C illustrates the SOT magnetic memory device during a sensing (e.g., reading) operation.

The magnetic junction in the SOT magnetic memory device comprises a combination of an SAF structure 120 and a spin valve 140. The combination of the SAF structure 120 and the spin valve 140 can include, from one side to another, a fixed ferromagnetic layer 112, an antiferromagnetic coupling layer 114, a reference layer 132, a nonmagnetic metallic barrier layer 134, and a free layer 136. The combination of the SAF structure 120 and the spin valve 140 can form a SOT MRAM cell 280 in the same configuration as in the first, second, and third embodiment MRAM cells 180. For example, the reference layer 132 can have a fixed magnetization direction, and the nonmagnetic metallic barrier layer 134 can be located between the reference layer 132, and the free layer 136. The nonmagnetic metallic barrier layer 134 can consist of at least one metallic material selected from Cu, Ag, AgSn, Cr, Ru, Ta, TaN, or CuN to enable a cryogenic operation. The free layer 136 has bistable magnetization states that include a parallel state having a magnetization that is parallel to the fixed vertical magnetization and an antiparallel state having a magnetization that is antiparallel to the fixed vertical magnetization.

In one embodiment, a metal line 200 is provided directly on a surface of the free layer 136. The metal line 200 can comprise, and/or can consist essentially of, at least one heavy elemental metal to maximize spin transfer across the interface between the free layer 136 and the metal line 200. In one embodiment, the elemental metal can have an atomic number in a range from, and including, 72 to, and including, 79. For example, the at least one elemental metal can include one or more of Hf, Ta, W, Re, Os, Ir, Pt, and Au. In one embodiment, the metal line 200 can comprise, and/or consist essentially of, tungsten. In other words, in an embodiment, the metal line 200 is made of an elemental metal which is undoped and unalloyed other than unavoidable impurities.

Figure 6:
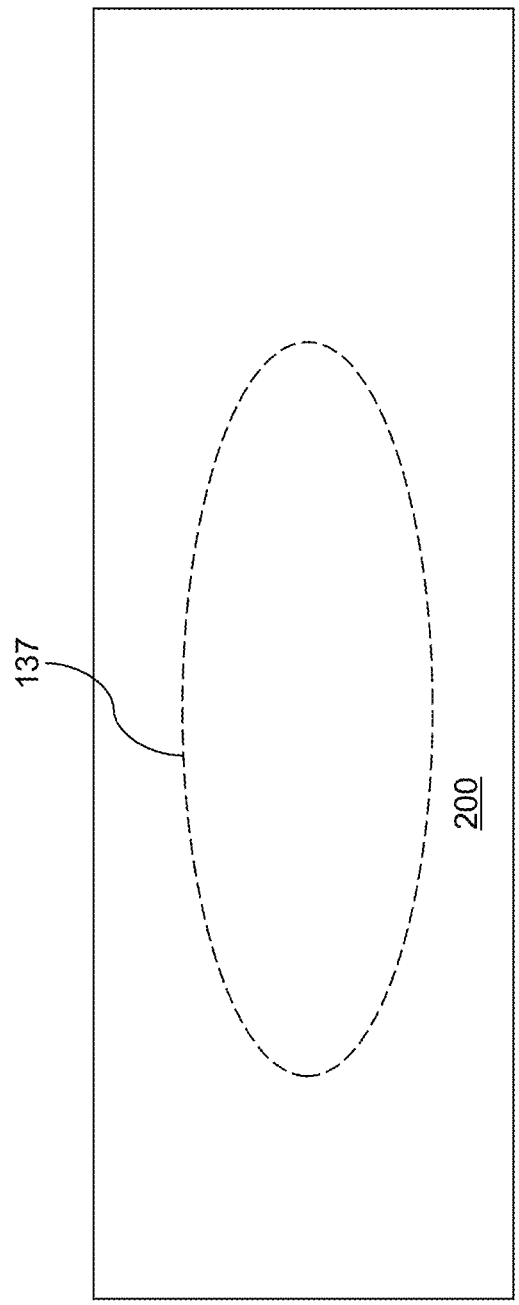
FIG. 6 illustrates a contact area between a free layer and a metal line within the exemplary SOT MRAM cell according to the fourth embodiment of the present disclosure.

A first electrode 910 can be located at and electrically connected to a first end of the metal line 200. The first electrode 910 can be electrically connected to a first voltage source V1 via a first transistor T1. A second electrode 920 can be located at and electrically connected to a second end of the metal line 200. The second electrode 920 can be electrically connected to a second voltage source (which can be ground) V2. The contacting surface of the free layer 136 that contacts the metal line 200 can be located between the first electrode 910 and the second electrode 920. Referring to FIG. 6, the area of the contacting surface 137 between the first electrode 910 and the second electrode 920 can be increased by employing an elongated surface that extends along the lengthwise direction of the metal line 200. The first, second and third voltage sources may comprise the same computer controlled voltage source having different connections to electrodes 910, 920 and 930 and/or two or three different voltage sources.

Referring back to FIGS. 5A-5C, a third electrode 930 can be electrically connected to the reference layer 132 directly or via the fixed ferromagnetic layer 112 of the SAF structure 120. The third electrode 930 can be connected to a third voltage source V3 via a second transistor T2. A programming controller 700 can be provided, which can be configured to control the first transistor T1 and the second transistor T2 to provide a two-step programming process for the magnetization of the free layer 136.

The two-step programming (i.e., writing) process can include a first programming pulse application step in which the first transistor T1 is turned on and the second transistor T2 is turned off. A first electrical current flows through the metal line 200 as illustrated in FIG. 5A. Employing a Cartesian coordinate system in which the x-axis is parallel to the lengthwise direction of the metal line 200, the y-axis is parallel to the plane of the contacting surface 137 (illustrated in FIG. 6), the magnetization of the free layer 136 changes due to the spin orbit torque effect. The current flows perpendicular to the stacking direction of the layers (132, 134, 136) of the spin valve 140 during the first programming pulse application.

In this case, the spin orbit torque $\tau_{SOT}$ applied during the first step of the programming operation can be given by:

$$\tau_{SOT} = \frac{2e}{\hbar} \theta_{SH} j_e \vec{m}_Z \times (\vec{m}_Z \times \vec{y})$$

in which e is the electrical charge of an electron, $\hbar$ is Plank's constant divided by $2\pi$, $\theta_{SH}$ is the Spin Hall angle, $J_e$ is the current density, $\vec{m}_z$ is the z component of the magnetization vector of the free layer 136, and $\vec{y}$ is the unit vector along they direction. The programming controller 700 can be configured to control the duration of the turn-on time of the first transistor T1 such that the first programming pulse application step rotates the magnetization of the free layer 136 from one of the bistable magnetization states to a transient state in which the magnetization of the free layer 136 is about 90 degrees, such as within a range from 80 degrees to 100 degrees, with respect to a direction of the magnetization of the free layer 136 prior to application of the first programming pulse application step. The spin orbit torque effect can generate a spin orbit torque of a high magnitude during the first programming step.

The two-step programming process can include a second programming pulse application step in which the second transistor T2 is turned on and the first transistor T1 is turned off. In this case, a second electrical current flows through spin valve 140 and between the surface of the free layer 136 and the second electrode 920 as illustrated in FIG. 5B. The magnetization of the free layer 136 changes due to the spin-torque transfer effect. In this case, the spin-transfer torque $\tau_{STT}$ applied during the second step of the programming operation can be given by:

$$\tau_{STT} = \frac{2e}{\hbar} \eta j_e \vec{m}_y \times (\vec{m}_y \times \vec{z})$$

in which e is the electrical charge of an electron, $\hbar$ is Plank's constant divided by $2\pi$, $\eta$ is the spin-transfer torque coefficient, $J_e$ is the current density, $\vec{m}_y$ is the y component of the magnetization vector of the free layer 136, and $\vec{z}$ is the unit vector along the z direction. The programming controller 700 can be configured to control the duration of the turn-on time of the second transistor T2 such that the second programming pulse application step rotates the magnetization of the free layer 136 to another of the bistable magnetization states, i.e., from a parallel state prior to the two-step programming operation to an antiparallel state after the two-step programming operation or vice versa. The current flows parallel to the stacking direction of the layers (132, 134, 136) of the spin valve 140 during the second programming pulse application.

Referring to FIG. 5C, a read operation can be performed by applying a low bias voltage across the second electrode 920 and the third electrode 930, and measuring the magnitude of the electrical current that passes through the spin valve 140. The magnitude of the read current through the spin valve 140 can be kept at a level that does not disturb the magnetization state of the free layer 136, i.e., at a level that is insufficient to apply enough torque to the magnetization of the free layer 136 to suppress a read disturb.

The spin orbit torque magnetic memory device of the fourth embodiment of the present disclosure benefits from application of a maximum initial torque in each of the first programming step and the second programming step regardless of the magnetization state of the free layer 136. Each of the spin-orbit torque mechanism and the spin-transfer torque mechanism can provide a respective 90 degree rotation of the magnetization of the free layer 136, leading to a total of 180 degree rotation, i.e., flipping of the magnetization of the free layer 136. The total switching power for the two-step programming process can be less than the total switching power employing solely the spin-orbit torque mechanism or solely the spin-transfer torque mechanism. The duration of a first programming pulse in the first programming step can be less than 5 ns, such as from 1 nm to 5 nm, and the duration of a second programming pulse in the second programming step can be less than 5 ns, such as from 1 nm to 5 nm. The metallic layers provide low resistance at cryogenic temperatures. Thus, the three-terminal spin-orbit torque magnetic memory device of the fourth embodiment of the present disclosure can per operated at low power at cryogenic temperatures, e.g., at temperatures lower than, or the same as, the boiling point or nitrogen (i.e., about 77 degrees Kelvin or −195.79° C.).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A MRAM device, comprising:
a spin valve comprising a reference layer having a fixed magnetization direction, a free layer, and a nonmagnetic metallic barrier layer located between the reference layer and the free layer;
a metallic assist structure configured to provide rotating spin transfer torque to the free layer to assist the free layer switching during programming; and
a first nonmagnetic metallic spacer layer located between the free layer and the metallic assist structure;
wherein the metallic assist structure comprises a negative-magnetic-anisotropy assist layer having negative magnetic anisotropy that provides an in-plane magnetization within a plane that is perpendicular to the fixed magnetization direction.

2. The MRAM device of claim 1, wherein:
the negative-magnetic-anisotropy assist layer has an easy magnetization plane that is perpendicular to the fixed magnetization of the reference layer;
the negative-magnetic-anisotropy assist layer has no easy axis direction within the easy magnetization plane;
the free layer has positive magnetic anisotropy to provide bistable magnetization states that include a parallel state having a magnetization that is parallel to the fixed vertical magnetization and an antiparallel state having a magnetization that is antiparallel to the fixed vertical magnetization; and
a magnetic energy of the negative-magnetic-anisotropy assist layer is invariant under rotation of the magnetization of the negative-magnetic-anisotropy assist layer within the horizontal plane.

3. The MRAM device of claim 1, wherein the negative-magnetic-anisotropy assist layer comprises a homogeneous negative magnetic anisotropy material.

4. The MRAM device of claim 3, wherein the negative-magnetic-anisotropy assist layer comprises a cobalt-iridium alloy or a cobalt-iron alloy.

5. The MRAM device of claim 4, wherein the negative-magnetic-anisotropy assist layer comprises the cobalt-iridium alloy comprising 70 to 90 atomic percent cobalt and 10 to 30 atomic percent iridium.

6. The MRAM device of claim 4, wherein the negative-magnetic-anisotropy assist layer comprises the cobalt-iron alloy comprising 90 to 99.5 atomic percent cobalt and 0.5 to 10 atomic percent iron.

7. The MRAM device of claim 1, wherein the negative-magnetic-anisotrpy assist layer comprises a multilayer stack including multiple repetitions of a first magnetic material layer and a second magnetic material layer.

8. The MRAM device of claim 7, wherein:
the first magnetic material layer comprises cobalt; and
the second magnetic material layer comprises iron.

9. A MRAM device, comprising:
a spin valve comprising a reference layer having a fixed magnetization direction, a free layer, and a nonmagnetic metallic barrier layer located between the reference layer and the free layer;
a metallic assist structure configured to provide rotating spin transfer torque to the free layer to assist the free layer switching during programming; and
a first nonmagnetic metallic spacer layer located between the free layer and the metallic assist structure;
wherein the metallic assist structure comprises:
a first magnetic assist layer;
a second magnetic assist layer; and
an antiferromagnetic coupling spacer layer located between the first and second magnetic assist layers, wherein the antiferromagnetic coupling spacer layer is configured to provide antiferromagnetic coupling between a first magnetization direction of the first magnetic assist layer and a second magnetization direction of the second magnetic assist layer.

10. The MRAM device of claim 9, wherein the first magnetization direction and the second magnetization direction are configured to precess around a vertical axis that is parallel to the fixed magnetization direction of the reference layer while maintaining an antiferromagnetic alignment therebetween upon application of current through the first magnetic assist layer, the antiferromagnetic coupling spacer layer, and the second magnetic assist layer.

11. The MRAM cell of claim 10, wherein:
the free layer has positive magnetic anisotropy to provide bistable magnetization states that include a parallel state having a magnetization that is parallel to the fixed vertical magnetization and an antiparallel state having a magnetization that is antiparallel to the fixed vertical magnetization; and
the fixed magnetization direction of the reference layer maintains the same orientation upon application of the current through the reference layer.

12. The MRAM cell of claim 9, wherein:
the first magnetization direction is a first in-plane magnetization that is perpendicular to the fixed magnetization direction of the reference layer; and
the second magnetization direction is a second in-plane magnetization that is perpendicular to the fixed magnetization direction of the reference layer.

13. The MRAM cell of claim 9, wherein:
the antiferromagnetic coupling spacer layer comprises ruthenium;
the first magnetic assist layer comprises a first magnetic material having first negative magnetic anisotropy; and
the second magnetic assist layer comprises a second magnetic material having second negative magnetic anisotropy.

14. The MRAM cell of claim 13, wherein each of the first magnetic assist layer and the second magnetic assist layer is selected from:
a homogeneous negative magnetic anisotropy material; and
a multilayer stack including multiple repetitions of a first magnetic material layer and a second magnetic material layer.

15. A MRAM device, comprising:
a spin valve comprising a reference layer having a fixed magnetization direction, a free layer, and a nonmagnetic metallic barrier layer located between the reference layer and the free layer;
a metallic assist structure configured to provide rotating spin transfer torque to the free layer to assist the free layer switching during programming; and
a first nonmagnetic metallic spacer layer located between the free layer and the metallic assist structure;
wherein the metallic assist structure comprises a spin torque oscillator stack; and
wherein the spin torque oscillator stack comprises a spin torque layer, a spin polarization layer and a second nonmagnetic metallic spacer located between the spin torque layer and the spin polarization layer.

16. The MRAM cell of claim 15, wherein:
the spin torque layer is located on the first nonmagnetic metallic spacer layer, the second nonmagnetic metallic spacer layer is located on the spin torque layer, and the spin polarization layer is located on the second nonmagnetic metallic spacer layer;
the spin torque layer comprises a first magnetic material having a first conical magnetization with respect to a vertical axis that is parallel to the fixed vertical magnetization direction of the reference layer; and
the spin polarization layer comprises a second magnetic material having a second conical magnetization with respect to the vertical axis that is parallel to the fixed vertical magnetization direction of the reference layer.

17. A spin orbit torque memory device, comprising:
a spin valve comprising a reference layer having a fixed magnetization direction, a free layer, and a nonmagnetic metallic barrier layer located between the reference layer and a first surface of the free layer;
a metal line contacting a second surface of the free layer, wherein the metal line consists essentially of at least one elemental metal having an atomic number from 72 to 79;
a first electrode electrically connected to a first end of the metal line and to a first transistor;
a second electrode electrically connected to a second end of the metal line, wherein the second surface of the free layer contacts the metal line between the first electrode and the second electrode;
a third electrode electrically connected to the reference layer and to a second transistor; and
a programming controller configured to control the first transistor and the second transistor to provide a two-step programming process for a magnetization of the free layer, wherein the two-step programming process comprises:
a first programming pulse application step in which the first transistor is turned on and the second transistor is turned off, and a first electrical current flows through the metal line between the first electrode and the second electrode; and
a second programming pulse application step in which the second transistor is turned on and the first transistor is turned off, and a second electrical current flows through the spin valve between the third electrode and the second electrode.

18. The spin orbit torque memory device of claim 17, further comprising a synthetic antiferromagnetic structure comprising the reference layer, a fixed ferromagnetic layer having a magnetization that is antiparallel to the fixed magnetization direction of the reference layer, and an antiferromagnetic coupling layer located between the reference layer and the fixed ferromagnetic layer.

19. A method of programming a spin orbit torque memory device, comprising a spin valve comprising a reference layer having a fixed magnetization direction, a free layer, and a nonmagnetic metallic barrier layer located between the reference layer and a first surface of the free layer, a metal line contacting a second surface of the free layer, a first electrode electrically connected to a first end of the metal line, a second electrode electrically connected to a second end of the metal line, and a third electrode electrically connected to the reference layer, the method comprising:
applying a first programming pulse between the first and the second electrodes such that a first electrical current flows through the metal line between the first electrode and the second electrode; and
applying a second programming pulse between the second and the third electrodes such that a second electrical current flows through the spin valve between the third electrode and the second electrode;
wherein the method is performed at a temperature below 77 degrees Kelvin.

20. The method of claim 19, wherein:
the first programming pulse duration is 5 ns or less; and
the second programming pulse duration is 5 ns or less.

* * * * *